(12) United States Patent
Arnold et al.

(10) Patent No.: US 9,786,853 B2
(45) Date of Patent: Oct. 10, 2017

(54) FLOATING EVAPORATIVE ASSEMBLY OF ALIGNED CARBON NANOTUBES

(71) Applicant: Wisconsin Alumni Research Foundation, Madison, WI (US)

(72) Inventors: Michael Scott Arnold, Middleton, WI (US); Padma Gopalan, Madison, WI (US); Gerald Joseph Brady, Madison, WI (US); Yongho Joo, Madison, WI (US); Harold T. Evensen, Verona, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/118,058

(22) PCT Filed: Feb. 11, 2015

(86) PCT No.: PCT/US2015/015342
§ 371 (c)(1),
(2) Date: Aug. 10, 2016

(87) PCT Pub. No.: WO2015/123251
PCT Pub. Date: Aug. 20, 2015

(65) Prior Publication Data
US 2017/0012228 A1    Jan. 12, 2017

Related U.S. Application Data

(63) Continuation-in-part of application No. 14/177,828, filed on Feb. 11, 2014, now Pat. No. 9,368,723.

(51) Int. Cl.
*H01L 29/06* (2006.01)
*H01L 29/08* (2006.01)
(Continued)

(52) U.S. Cl.
CPC ...... *H01L 51/0558* (2013.01); *C01B 31/0246* (2013.01); *H01L 51/0003* (2013.01);
(Continued)

(58) Field of Classification Search
CPC ............ H01L 51/0558; H01L 51/0048; H01L 51/0003; H01L 51/0039; H01L 51/0049; C01B 31/0246
See application file for complete search history.

(56) References Cited

U.S. PATENT DOCUMENTS 8,128,993 B2    3/2012  Rueckes et al.
9,368,723 B2 *  6/2016  Arnold ................ H01L 51/0003
(Continued)

FOREIGN PATENT DOCUMENTS

WO    WO 2011087913    7/2011
WO    WO 2013154490    10/2013

OTHER PUBLICATIONS

Extended European Search Report mailed in European Patent Application No. 15748675.4, Aug. 25, 2017.
(Continued)

*Primary Examiner* — Victor A Mandala
(74) *Attorney, Agent, or Firm* — Bell & Manning, LLC

(57) ABSTRACT

High density films of semiconducting single-walled carbon nanotubes having a high degree of nanotube alignment are provided. Also provided are methods of making the films and field effect transistors (FETs) that incorporate the films as conducting channel materials. The single-walled carbon nanotubes are deposited from a thin layer of organic solvent containing solubilized single-walled carbon nanotubes that is spread over the surface of an aqueous medium, inducing evaporative self-assembly upon contacting a solid substrate.

6 Claims, 23 Drawing Sheets

(51) Int. Cl.
    *H01L 51/05*    (2006.01)
    *H01L 51/00*    (2006.01)
    *C01B 31/02*    (2006.01)

(52) U.S. Cl.
    CPC ...... *H01L 51/0048* (2013.01); *H01L 51/0039* (2013.01); *H01L 51/0049* (2013.01)

(56) References Cited

U.S. PATENT DOCUMENTS

| | | |
|---|---|---|
| 9,425,405 B1 * | 8/2016 | Arnold ............... H01L 51/0007 |
| 2004/0192072 A1 | 9/2004 | Snow et al. |
| 2007/0246784 A1 | 10/2007 | Kang et al. |
| 2014/0120714 A1 | 5/2014 | Farmer et al. |
| 2015/0209198 A1 | 7/2015 | Aizenberg et al. |

OTHER PUBLICATIONS

Giancane et al., State of art in the preparation, characterisation and applications of Langmuir-Blodgett films of carbon nanotubes, Colloids and Surfaces A: Physicochem. Eng. Aspects 354, Oct. 2, 2009, pp. 81-90.

Zhang et al., Facile One-Step Fabrication of Ordered Organic Nanowire Films, Advanced Materials 21, Jun. 24, 2009, pp. 4172-4175.

\* cited by examiner

FLOATING EVAPORATIVE ASSEMBLY OF ALIGNED CARBON NANOTUBES

REFERENCE TO GOVERNMENT RIGHTS

This invention was made with government support under 1129802 and 0520527 awarded by the National Science Foundation. The government has certain rights in the invention.

CROSS-REFERENCE TO RELATED APPLICATIONS

The present application is a National Stage Entry of International Application No. PCT/US15/15342 that was filed Feb. 11, 2015, which claims priority of U.S. patent application Ser. No. 14/177,828 that was filed on Feb. 11, 2014, the entire contents of which are hereby incorporated by reference.

BACKGROUND

Single-walled carbon nanotubes (SWCNTs) are key building blocks for nanoscale science and technology due to their interesting physical and chemical properties. SWCNTs are particularly promising for high speed and low power semiconductor electronics. A challenge, however, is the hierarchical organization of these building blocks into organized assemblies and, ultimately, useful devices. Ordered structures are necessary, as random network SWCNT thin films result in sub-optimal electronic properties including reduced channel conductance and mobility. Numerous techniques for aligning SWCNTs have been explored to solve this shortcoming and achieve higher conductance and mobility. These approaches can be divided into two main categories: (a) direct growth via chemical vapor deposition and arc-discharge, and (b) post synthetic assembly. In the case of direct growth, both metallic and semiconducting SWCNTs are produced. In this case, the performance of SWCNT field effect transistors (FETs) is limited by the metallic SWCNTs (m-SWCNTs), thus motivating attempts to purify semiconducting SWCNT (s-SWCNT) samples with homogeneous electronic properties.

A variety of post-synthetic sorting methods have been developed to separate m- and s-SWCNTs according to their specific physical and electronic structures, which are usually implemented in aqueous or organic solutions. In order to take advantage of the high purity of s-SWCNTs that can be produced by these solution-based sorting approaches in semiconductor electronic devices, solution-based methods for assembling and aligning s-SWCNTs, such as evaporation-driven self-assembly, blown-bubble assembly, gas flow self-assembly, spin-coating, Langmuir-Blodgett and -Shafer methods, contact-printing assembly, and AC electrophoresis, have been developed. (See, Shastry, T. A.; Seo, J. W.; Lopez, J. J.; Arnold, H. N.; Kelter, J. Z.; Sangwan, V. K.; Lauhon, L. J.; Marks, T. J.; Hersam, M. C. Large-area, electronically monodisperse, aligned single-walled carbon nanotube thin films fabricated by evaporation-driven self-assembly. *Small* 2013, 9, 45-51; Druzhinina, T.; Hoeppener, S.; Schubert, U. S. Strategies for Post-Synthesis Alignment and Immobilization of Carbon Nanotubes. *Adv. Mater.* 2011, 23, 953-970; Yu, G.; Cao, A.; Lieber, C. M. Large-area blown bubble films of aligned nanowires and carbon nanotubes. *Nat. Nanotechnol.* 2007, 2, 372-7; Wu, J.; Jiao, L.; Antaris, A.; Choi, C. L.; Xie, L.; Wu, Y.; Diao, S.; Chen, C.; Chen, Y.; Dai, H. Self-Assembly of Semiconducting Single-Walled Carbon Nanotubes into Dense, Aligned Rafts. *Small* 2013, 9, 4142; LeMieux, M. C.; Roberts, M.; Barman, S.; Jin, Y. W.; Kim, J. M.; Bao, Z. Self-sorted, aligned nanotube networks for thin-film transistors. *Science* 2008, 321, 101-4; Cao, Q.; Han, S. J.; Tulevski, G. S.; Zhu, Y.; Lu, D. D.; Haensch, W. Arrays of single-walled carbon nanotubes with full surface coverage for high-performance electronics. *Nat. Nanotechnol.* 2013, 8, 180-6; Jia, L.; Zhang, Y.; Li, J.; You, C.; Xie, E. Aligned single-walled carbon nanotubes by Langmuir-Blodgett technique. *J. Appl. Phys.* 2008, 104, 074318; Liu, H.; Takagi, D.; Chiashi, S.; Homma, Y. Transfer and alignment of random single-walled carbon nanotube films by contact printing. *ACS Nano* 2010, 4, 933-8 and Shekhar, S.; Stokes, P.; Khondaker, S. I. Ultrahigh density alignment of carbon nanotube arrays by dielectrophoresis. *ACS Nano* 2011, 5, 1739-46.) While each of these methods has its strengths, new methods are still needed to improve the fidelity of s-SWCNT assembly and alignment in order to enable the fabrication of practical s-SWCNT-based electronic devices.

SUMMARY

High density films of s-SWCNTs having a high degree of nanotube alignment are provided. Also provided are methods of making the films and field effect transistors that incorporate the films as conducting channel materials.

One aspect of the invention provides methods for dose-controlled floating evaporative self-assembly (Dose-Controlled FESA) of s-SWCNTs in s-SWCNT films.

One embodiment of a method of forming a film of aligned s-SWCNTs on a substrate using Dose-Controlled FESA includes the steps of: (a) partially submerging a hydrophobic substrate in an aqueous medium; (b) applying a dose of a liquid solution to the aqueous medium, the liquid solution comprising semiconductor-selective-polymer-wrapped s-SWCNTs dispersed in an organic solvent, whereby the liquid solution spreads into a layer on the aqueous medium at an air-liquid interface and semiconductor-selective-polymer-wrapped s-SWCNTs from the layer are deposited as a stripe of aligned semiconductor-selective-polymer-wrapped s-SWCNTs on the hydrophobic substrate; and (c) at least partially withdrawing the hydrophobic substrate from the aqueous medium, such that the portion of the hydrophobic substrate upon which the stripe of aligned semiconductor-selective-polymer-wrapped s-SWCNTs is deposited is withdrawn from the air-liquid interface. Steps (b) and (c) may be repeated one or more times in sequence to deposit one or more additional stripes of aligned semiconductor-selective-polymer-wrapped s-SWCNTs on the hydrophobic substrate.

Another aspect of the invention provides methods for continuous floating evaporative self-assembly (Continuous FESA) of s-SWCNTs in s-SWCNT films.

One embodiment of a method of forming a film of aligned s-SWCNTs on a substrate using Continuous FESA includes the steps of: (a) partially submerging a hydrophobic substrate in an aqueous medium; (b) supplying a continuous flow of a liquid solution to the aqueous medium, the liquid solution comprising semiconductor-selective-polymer-wrapped s-SWCNTs dispersed in an organic solvent, whereby the liquid solution spreads into a layer on the aqueous medium at an air-liquid interface and semiconductor-selective-polymer-wrapped s-SWCNTs from the layer are deposited as a film of aligned semiconductor-selective-polymer-wrapped s-SWCNTs on the hydrophobic substrate, wherein the organic solvent in the layer, which is continuously evaporating, is also continuously resupplied by the flow of liquid solution during the formation of the film; and (c) withdrawing the hydrophobic substrate from the aqueous medium, such that the film of aligned semiconductor-selective-polymer-wrapped s-SWCNTs is grown along the length of the hydrophobic substrate as it is withdrawn from the aqueous medium.

Embodiments of films comprising aligned s-SWCNTs made by Dose-Controlled and/or Continuous FESA, can be characterized in that the s-SWCNTs in the film have a degree of alignment of about ±20° or better and the single-walled carbon nanotube linear packing density in the film is at least 40 single-walled carbon nanotubes/μm. In some embodiments, the films have a semiconducting single-walled carbon nanotube purity level of at least 99.9%.

Embodiments of field effect transistors includes: a source electrode; a drain electrode; a gate electrode; a conducting channel in electrical contact with the source electrode and the drain electrode, the conducting channel comprising a film comprising the aligned s-SWCNTs, wherein the s-SWCNTs in the film have a degree of alignment of about ±20° or better and the single-walled carbon nanotube linear packing density in the film is at least 40 single-walled carbon nanotubes/μm; and a gate dielectric disposed between the gate electrode and the conducting channel. Some embodiments of the transistors have an on-conductance per width of at least 5 μS μm$^{-1}$ and an on/off ratio per width of at least $1 \times 10^5$.

Other principal features and advantages of the invention will become apparent to those skilled in the art upon review of the following drawings, the detailed description, and the appended claims.

DETAILED DESCRIPTION

High density films of s-SWCNTs having a high degree of nanotube alignment are provided. Also provided are methods of making the films and field effect transistors that incorporate the films as conducting channel materials.

In one aspect of the technology, the films are formed using a method referred to in this disclosure as "dose-controlled, floating evaporative self-assembly", or "Dose-Controlled FESA". This method uses a thin layer of organic solvent containing solubilized s-SWCNTs at an air-liquid interface to deposit films of aligned s-SWCNTs on a partially submerged hydrophobic substrate. The method decouples the s-SWCNT film formation from the evaporation of a bulk liquid medium and, by iteratively applying the s-SWCNTs in controlled "doses", allows for the rapid sequential deposition of a series of narrow s-SWCNTs films, or "stripes", with continuous control over the width, s-SWCNT density and periodicity of the stripes. The resulting films can be characterized by a high degree of s-SWCNT alignment and high s-SWCNT densities. As a result, they are well suited for use as channel materials in FETs having high on-conductance values and high on/off ratios.

An advantage of the dose-controlled, floating evaporative self-assembly method is that it allows for the deposition of s-SWCNTs with exceptional electronic-type purity—sorted using semiconductor-selective polymers—in organic solvents. Unlike anionic surfactants, which have been used to sort s-SWCNTs in aqueous solution, semiconductor-selective polymers are advantageous because they can sensitively and selectively "pick out" semiconducting nanotubes directly during dispersion from raw SWCNT powders, thereby avoiding the need for subsequent post-dispersion sorting.

Figure 1:
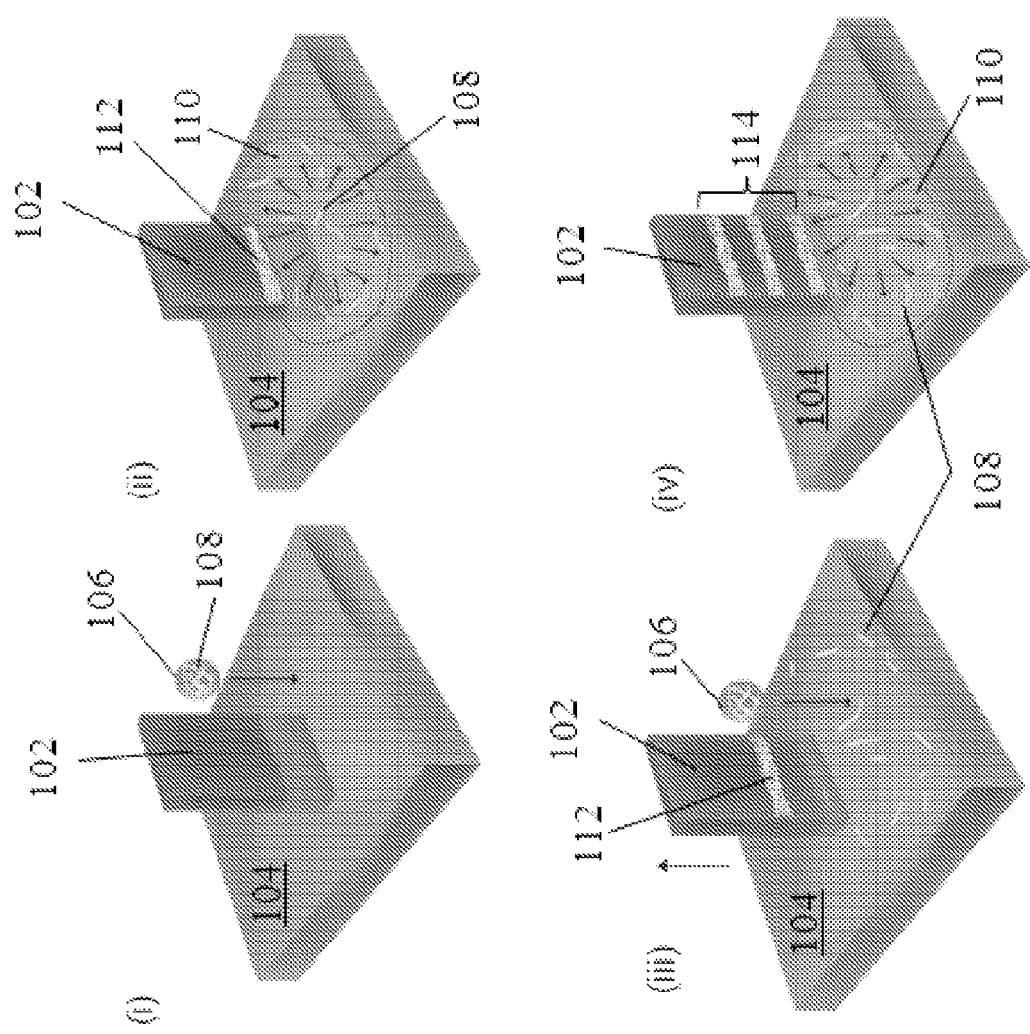
FIG. 1. A schematic illustration of the iterative process used to fabricate a film of s-SWCNTs, driven by the spreading and evaporation of controlled doses of organic solvent at an air/water interface.

An embodiment of the dose-controlled, floating evaporative self-assembly method is illustrated schematically in FIG. 1. As shown in panel (i) of the figure, the method begins with a hydrophobic substrate 102 partially submerged in an aqueous liquid medium 104, such as water. A dose of a liquid solution in the form of a droplet 106 is dropped into liquid medium 104, preferably in close proximity to substrate 102. The liquid solution, which is also referred to herein as an "organic ink" or a "s-SWCNT ink", comprises s-SWCNTs 108 dispersed in an organic solvent 110. The s-SWCNTs have a semiconductor-selective polymer coated on their surfaces and are referred to herein as "semiconductor-selective-polymer-wrapped" s-SWCNTs. The liquid solution spreads (represented by solid arrows in the figure) into a thin layer over the surface of aqueous liquid medium 104 at the air-liquid interface (panel (ii)). Driven by diffusion, semiconductor-selective-polymer-wrapped s-SWCNTs 108 in the thin layer of liquid solution come into contact with and deposit onto hydrophobic substrate 102 as a stripe 112 of aligned s-SWCNTs near the air-liquid interface, while organic solvent 110 rapidly evaporates. Stripe 112 spans the width of the substrate. Without intending to be bound to a particular theory, the inventors believe that the s-SWCNTs adopt an aligned configuration because, as the solvent level rapidly decreases during evaporation, the s-SWCNTs tend to orient perpendicular to the evaporation front because that is sterically a more favored position. It is also likely that there is less of a steric penalty for the s-SWCNTs to turn sideways, rather than for them to stand up out of the solvent layer into the air while the solvent front recedes.

Once stripe 112 has been formed, substrate 108 can be elevated such that the stripe is withdrawn from the air-liquid interface (panel (iii)). Additional doses of the liquid solution can be added sequentially and the process repeated to form a series of stripes 114 comprising aligned s-SWCNTs (panel (iv)). Using this process, very thin films of s-SWCNTs—typically having a thickness of only a monolayer or a bilayer of s-SWNCTs—can be deposited.

Optionally, the semiconductor-selective polymer can be partially or entirely removed from the s-SWCNTs after stripe formation. This can be accomplished, for example, using a polymer-selective dry or wet chemical etchant or through selective thermal decomposition of the polymer. In some embodiments of the methods, the amount of semiconductor-selective polymer on the s-SWCNTs can be reduced prior to adding them to the dose.

By controlling the velocity of the withdrawal of substrate 108, the stripe width (i.e., the dimension of the stripe that runs parallel to the direction of withdrawal), stripe periodicity and s-SWCNT density of the stripes can be carefully controlled. The optimal substrate withdrawal rate can depend on a variety of factors, including the desired characteristics of the final deposited films, the nature of the substrate and/or the rate of dose dispensation. The present methods are able to deposit stripes over a large substrate surface area rapidly, even at room temperature (about 23° C.) and atmospheric pressure. For example, in some embodiments, the methods deposit stripes of aligned s-SWCNTs at a substrate withdrawal rate of at least 1 mm/min. This includes embodiments in which the substrate withdrawal rate is at least 5 mm/min. By way of illustration, using such high withdrawal rates, the present methods are able to deposit a series of stripes of aligned s-SWCNTs with a periodicity of 200 µm or less over the entire surface of a 12 inch wafer (e.g., Si wafer) in less than one hour.

The dose of liquid solution that contains the organic solvent and the solvated polymer-wrapped s-SWCNTs is a quantity of liquid, such as a droplet, having a volume much smaller than that of the aqueous medium to which it is delivered. By using very small volume doses to deliver the s-SWCNTs to a substrate, Dose-Controlled FESA is able to form high density films with very small quantities of SWCNTs and organic solvents, relative to other solution-based SWCNT deposition methods. By way of illustration only, the doses used in the present methods may have a volume in the range from about 0.5 to about 50 µl. However, volumes outside of this range can be used. The concentration of SWCNTs in each dose can be adjusted to control the density of s-SWCNTs in a deposited stripe. If a plurality of stripes are deposited, the concentration of s-SWCNTs in different doses can be the same or different. By way of illustration only, the doses used in the present methods may have a SWCNT concentration in the range from about 1 to about 50 µg/ml. However, concentrations outside of this range can be used. The dose dispensation rate can be adjusted to control the periodicity of the stripes formed on a substrate. If a plurality of stripes are deposited, the dose dispensation rate can be kept constant throughout the method to provide regularly spaced stripes on a substrate. Alternatively, the dose dispensation rate can be changed throughout the method to provide stripes having different inter-stripe spacings.

The substrate onto which the films comprising aligned semiconductor-selective-polymer-wrapped s-SWCNTs are deposited are sufficiently hydrophobic that the polymer-wrapped s-SWCNTs have a higher affinity for the substrate than the aqueous medium. The hydrophobic substrates can be composed of a hydrophobic material or can comprise a hydrophobic surface coating over a support substrate. Hydrophobic polymers are examples of materials that can be used as substrate materials, including coatings. If the films are to be used as a channel material in an FET, the substrate can comprise a gate dielectric material, such as $SiO_2$, coated with a hydrophobic coating.

In another aspect of the technology, the films are formed using a method referred to in this disclosure as "continuous, floating evaporative self-assembly" (continuous FESA). This method uses a thin layer of a solution of organic solvent containing solubilized s-SWCNTs at an air-liquid interface to deposit films of aligned s-SWCNTs on a partially submerged hydrophobic substrate. The methods decouple the s-SWCNT film formation from the evaporation of a bulk liquid medium and allow for the rapid deposition of a continuous film of aligned s-SWCNTs characterized by a high degree of s-SWCNT alignment and high s-SWCNT densities. As a result, the films are well suited for use as channel materials in FETs having high on-conductance values and high on/off ratios.

In the methods the solutions of the s-SWCNTs are continuously supplied into a spreading and evaporating puddle of an organic solvent on the surface of a bulk liquid medium. Where the puddle meets the surface of the hydrophobic substrate, it forms a macroscopically stable, steady state meniscus on the surface and s-SWCNTs in the puddle migrate to the surface of the hydrophobic substrate where they form a thin film. The supply of the solution of the s-SWCNTs is "continuous" in the sense that the flow of the solution onto the liquid medium continues during the film growth process from its initiation until the film is substantially complete, such that the puddle on the bulk liquid, which is continuously evaporating, is also continuously resupplied throughout the film growth process. Without intending to be bound to any particular theory of the invention, the inventors believe that once the initial puddle of s-SWCNT solution is formed, subsequently added solution being introduced via the continuous flow does not interact with the surface of the underlying bulk liquid and, therefore, hydrodynamic flow is established in the puddle.

An advantage of the continuous, floating evaporative self-assembly method is that it allows for the deposition of s-SWCNTs with exceptional electronic-type purity (pre-sorted using semiconductor-selective polymers) in organic solvents. Unlike anionic surfactants, which have been used to sort s-SWCNTs in aqueous solution, semiconductor-selective polymers are advantageous because they can sensitively and selectively "pick out" semiconducting nanotubes directly during dispersion from raw SWCNT powders, thereby avoiding the need for subsequent post-dispersion sorting.

Figure 19:
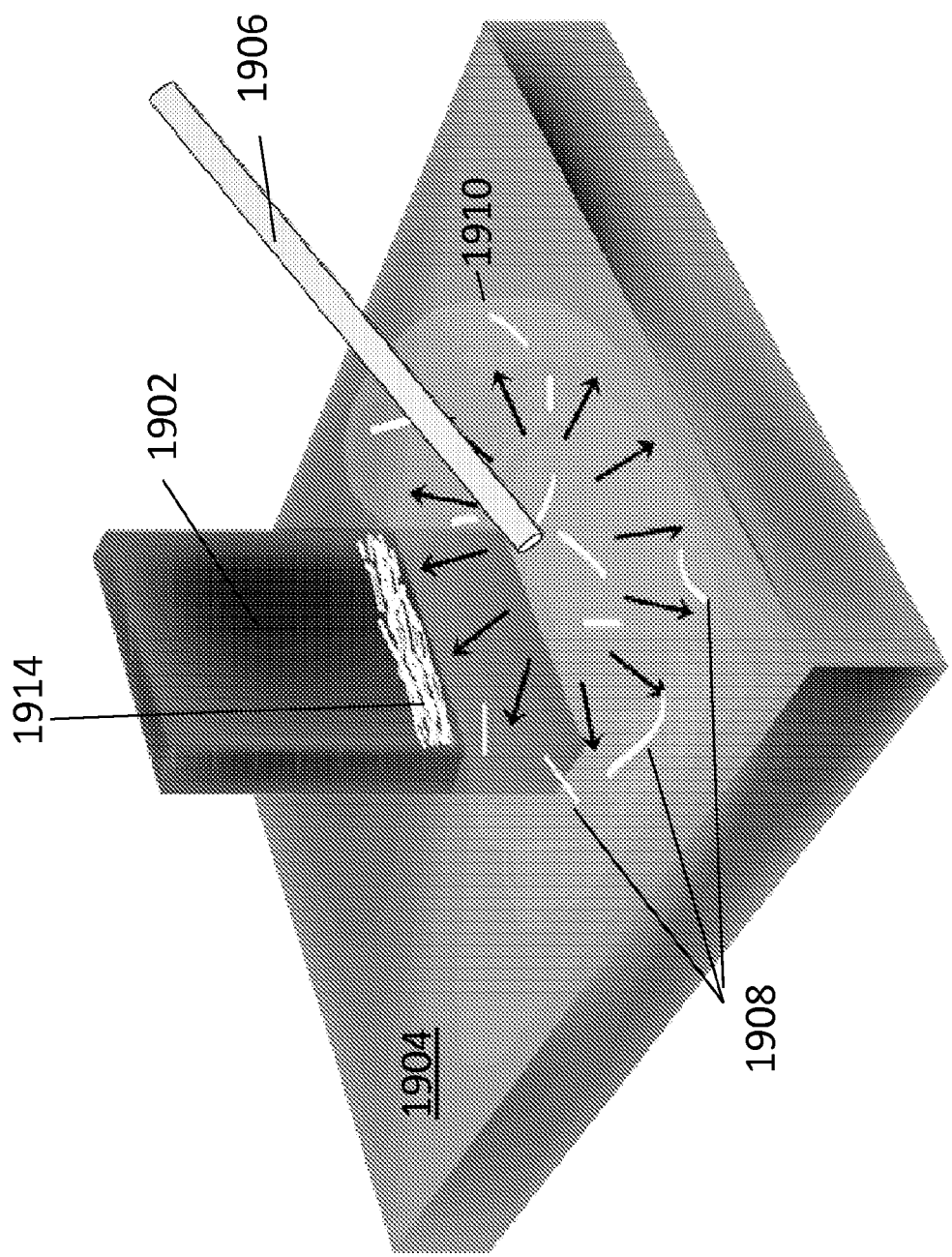
FIG. 19. A schematic illustration of an embodiment of a method of forming an aligned s-SWCNT film on the surface of a substrate.

An embodiment of the continuous, floating evaporative self-assembly method is illustrated schematically in FIG. 19. As shown in the figure, the method begins with a hydrophobic substrate 1902 partially submerged in an aqueous liquid medium 1904, such as water. A continuous flow of liquid solution from, for example, a syringe 1906 in contact with the surface of liquid medium 1904, is directed onto liquid medium 1904, preferably in close proximity to substrate 1902. The liquid solution, which is also referred to herein as an "organic ink" or an "s-SWCNT ink", comprises s-SWCNTs 1908 dispersed in an organic solvent. The s-SWCNTs have a semiconductor-selective polymer coated on their surfaces and are referred to herein as "semiconductor-selective-polymer-wrapped" s-SWCNTs. The liquid solution spreads (represented by solid arrows in the figure) into a thin layer (a puddle 1910) over the surface of aqueous liquid medium 1904 at the air-liquid interface. Driven by diffusion, semiconductor-selective-polymer-wrapped s-SWCNTs 1908 in puddle 1910 come into contact with and deposit onto hydrophobic substrate 1902 as a film 1912 of aligned s-SWCNTs near the air-liquid interface. As organic solvent in puddle 1910 continuously evaporates and is continuously replenished by the continuous flow of the s-SWCNT ink from syringe 1906, ink puddle 1910 reaches a steady state in which the solution flow rate and the solvent evaporation rate are equal or substantially equal. Deposited film 1912 spans the width of the substrate.

Once the growth of film 1912 has been initiated, substrate 1908 can be elevated such that the top of the continuously growing film is withdrawn from the air-liquid interface, allowing the film to continue growing along the length of the substrate as it is withdrawn. The liquid solution can be added continuously until a film of the aligned s-SWCNTs having a desired length has been growth. Using this process, very thin films of s-SWCNTs—typically having a thickness of only a monolayer or a bilayer of s-SWNCTs—can be deposited.

Figure 20:
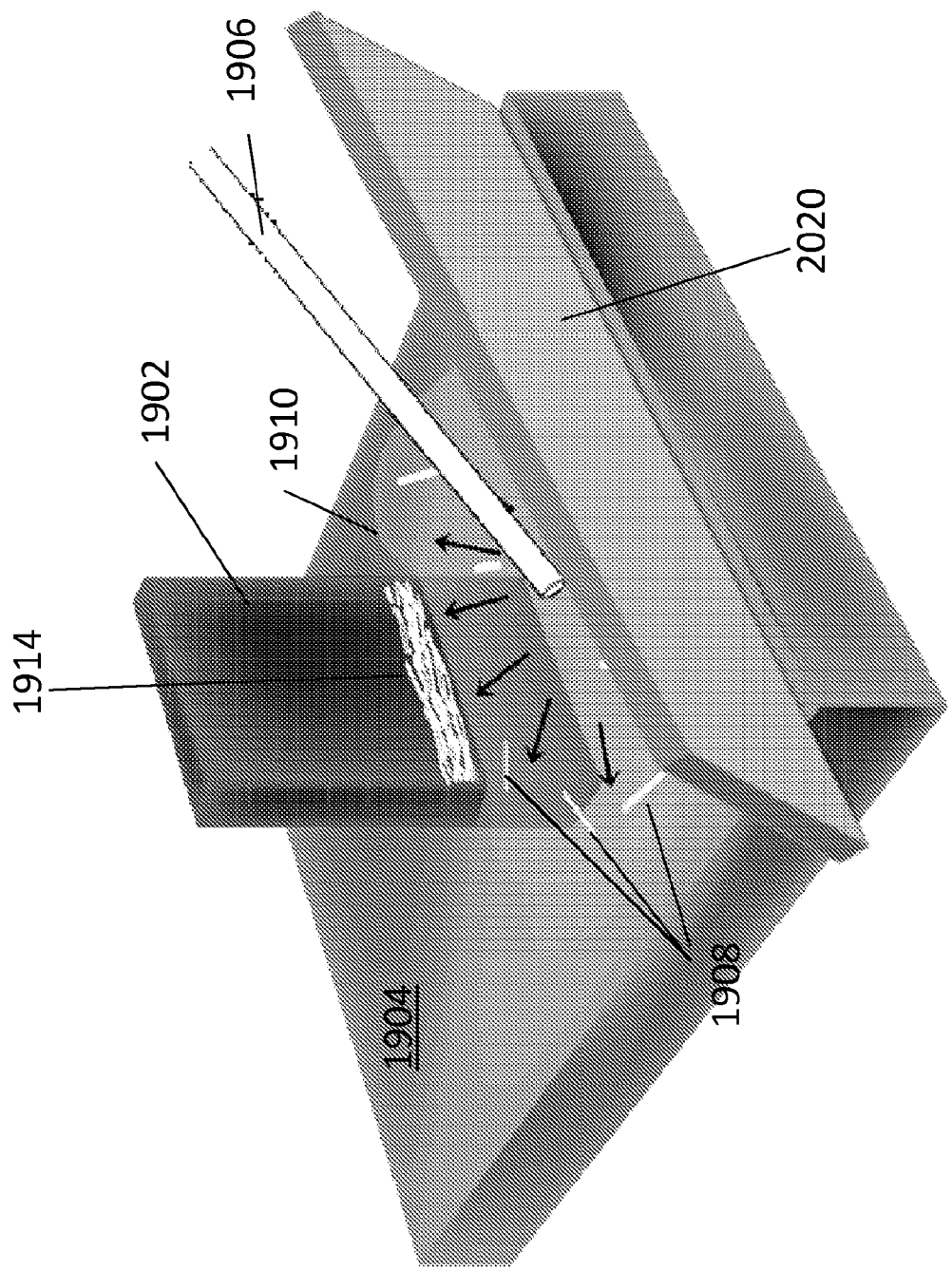
FIG. 20. A schematic illustration of another embodiment of a method of forming an aligned s-SWCNT film on the surface of a substrate.

Another embodiment of the continuous, floating evaporative self-assembly method is illustrated schematically in FIG. 20. This method is the same as that depicted in FIG. 19, except that a physical barrier (a dam) 2020 is partially submerged in liquid medium 1904 opposite syringe 1906 in order to confine the outward flow of puddle 1910.

Optionally, the semiconductor-selective polymer can be partially or entirely removed from the deposited s-SWCNTs after film formation. This can be accomplished, for example, using a polymer-selective dry or wet chemical etchant or through selective thermal decomposition of the polymer. In some embodiments of the methods, the amount of semiconductor-selective polymer on the s-SWCNTs can be reduced prior to adding them to the organic solution.

By controlling the velocity of the withdrawal of substrate 1908, the film length (i.e., the dimension of the film that runs parallel to the direction of withdrawal) and s-SWCNT density along the length of the film can be carefully controlled. The optimal substrate withdrawal rate can depend on a variety of factors, including the desired characteristics of the final deposited films, the nature of the substrate and/or the concentration of s-SWCNTs in the organic solution. The present methods are able to deposit films over a large substrate surface area rapidly, even at room temperature (about 23° C.) and atmospheric pressure. For example, in some embodiments, the methods deposit films of aligned s-SWCNTs at a substrate withdrawal rate of at least 1 mm/min. This includes embodiments in which the substrate withdrawal rate is at least 5 mm/min. By way of illustration, using such high withdrawal rates, the present methods are able to deposit a continuous film of aligned s-SWCNTs over the entire surface of a 12 inch wafer (e.g., Si wafer) in less than one hour.

The puddle of liquid solution that contains the organic solvent and the solvated polymer-wrapped s-SWCNTs has a volume much smaller than that of the bulk liquid medium to which it is delivered. By using very small volumes of solution to deliver the s-SWCNTs to a substrate, the Continuous FESA is able to form high density films with very small quantities of SWCNTs and organic solvents, relative to other solution-based SWCNT deposition methods. The concentration of SWCNTs in the flow of liquid that feeds the puddle can be adjusted to control the density of s-SWCNTs along the length of the film. The concentration of s-SWCNTs along the length of the growing film can be the same, or can be different—as in the case of a film having an s-SWCNT concentration gradient along its length. By way of illustration only, the organic solutions used in the present methods may have a SWCNT concentration in the range from about 1 to about 50 µg/ml. However, concentrations outside of this range can be used.

The substrate onto which the films comprising aligned semiconductor-selective-polymer-wrapped s-SWCNTs are deposited are sufficiently hydrophobic that the polymer-wrapped s-SWCNT become adsorbs thereto. The hydrophobic substrates can be composed of a hydrophobic material or can comprise a hydrophobic surface coating over a support substrate. Hydrophobic polymers are examples of materials that can be used as substrate materials, including coatings. If the films are to be used as a channel material in an FET, the substrate can comprise a gate dielectric material, such as $SiO_2$, coated with a hydrophobic coating.

Depending on the intended application of the continuous aligned s-SWCNT films deposited by Continuous FESA, it may be desirable to define a pattern in the films. For example, the films can be patterned into a series of lines, an array dots, and the like. Therefore, some embodiments of the methods include a post film-growth step in which the films are lithographically patterned using, for example, photolithography techniques. For example, if the films of aligned s-SWCNTs are to be used as the channel material in an FET, a pattern comprising a series of parallel stripes of the aligned s-SWCNTs can be formed in the film.

The density of SWCNTs in the stripes and films formed by Dose-Controlled or Continuous FESA refers to their linear packing density, which can be quantified in terms of the number of SWCNTs per μm and measured as described in Joo et al., Langmuir, 2014, 30(12), pp. 3460-3466 ("Joo et al.") and in Example 1, below. In some embodiments, the floating evaporative self-assembly method deposits stripes or films having a SWCNT density of at least 30 SWCNTs/μm. This includes embodiments in which the stripes or films have a SWCNT density of at least 35 SWCNTs/μm, at least 40 SWCNTs/μm, at least 45 SWCNTs/μm and at least about 50 SWCNTs/μm.

The degree of alignment of the SWCNTs in the stripes and films formed by Dose-Controlled or Continuous FESA refers to their degree of alignment along their longitudinal axes within a stripe or film, which can be quantified as described in Joo et al. In some embodiments, the floating evaporative self-assembly deposits stripes or films having a SWCNT degree of alignment of ±20° or better. This includes embodiments in which the SWCNTs have a degree of alignment of ±17° or better, further includes embodiments in which the SWCNTs have a degree of alignment of ±15° or better and still further includes embodiments in which the SWCNTs have a degree of alignment of ±10° or better.

The semiconductor-selective polymer that wraps the s-SWCNTs may be present by virtue of a highly selective pre-sorting of the s-SWCNT from a starting sample containing both s-SWCNTs and m-SWCNTs. The semiconductor-selective polymers selectively attach to (e.g., adsorb on) the surfaces of s-SWCNTs relative to the surfaces of m-SWCNTs. This allows for the separation of the selectively wrapped s-SWCNTs from the m-SWCNTS using, for example, centrifugation and filtration. By pre-sorting the SWCNTs to remove m-SWCNTs, films having very high s-SWCNT purity levels can be formed, where s-SWCNT purity level refers to the percentage of SWCNTs in the stripe or film that are s-SWCNTs. For example, some of the stripes or films formed by Dose-Controlled or Continuous floating evaporative self-assembly have an s-SWCNT purity level of at least 99%. This includes stripes or films having an s-SWCNT purity level of at least 99.5% and further includes stripes or films having an s-SWCNT purity level of at least 99.9%.

A number of semiconductor-selective polymers are known. Description of such polymers can be found, for example, in Nish, A.; Hwang, J. Y.; Doig, J.; Nicholas, R. J. Highly selective dispersion of single-walled carbon nanotubes using aromatic polymers. *Nat. Nanotechnol.* 2007, 2, 640-6. The semiconductor-selective polymers are typically organic polymers with a high degree of π-conjugation and include polyfluorene derivatives, such as poly(9,9-dialkylfluorene) derivatives, and poly(phenyl vinylene) derivatives. While the semiconductor-selective polymers may be conductive or semiconductive polymers, they can also be electrically insulating.

The organic solvent desirably has a relatively low boiling point at the film deposition temperature and pressure, typically ambient temperature and pressure, such that it evaporates rapidly. In addition, it should have the capacity to solubilize the semiconductor-selective-polymer-wrapped s-SWCNTs. Examples of suitable organic solvents include chloroform, dichloromethane, N,N-dimethylformamide, benzene, dichlorobenzene, toluene and xylene.

FETs comprising the films of aligned s-SWCNTs as channel materials generally comprise a source electrode and a drain electrode in electrical contact with the channel material; a gate electrode separated from the channel by a gate dielectric; and, optionally, an underlying support substrate. Various materials can be used for the components of the FET. For example, an FET may include a channel comprising a film comprising aligned s-SWCNTs, a $SiO_2$ gate dielectric, a doped Si layer as a gate electrode and metal (Pd) films as source and drain electrodes. However, other materials may be selected for each of these components. Channel materials comprising the highly aligned s-SWCNTs having high s-SWCNT purity levels and high SWCNT density are able to provide FETs characterized by both high on-conductance per width ($G_{ON}/W$ (μS/μm)) and high on/off ratios. For example, some embodiments of the FETs have an on-conductance per width of at least 5 μS μm$^{-1}$ and an on/off ratio per width of at least 1×10$^5$. This includes FETs having on-conductance per width greater than 7 μS μm$^{-1}$ and an on/off ratio per width of at least 1.5×10$^5$ and further includes FETs having on-conductance per width greater than 10 μS μm$^{-1}$ and an on/off ratio per width of at least 2×10$^5$. These performance characteristics can be achieved with channel lengths in the range from, for example, about 400 nm to about 9 μm, including channel lengths in the range from about 1 μm to about 4 μm.

EXAMPLES

Example 1

In this example, arrays of parallel stripes comprising aligned s-SWCNTs with exceptional electronic-type purity levels (99.9% s-SWCNTs) were deposited at high deposition velocities using the dose-controlled, floating evaporative self-assembly process with control over the placement of the stripes and the quantity of s-SWCNTs.

By decoupling the s-SWCNT stripe formation from the evaporation of the bulk solution and by iteratively applying the s-SWCNTs in controlled doses, the dose-controlled, floating evaporative self-assembly process formed stripes in which the s-SWCNTs were aligned within ±14°, were packed at a density of ~50 s-SWCNTs μm$^{-1}$, and constituted primarily a well-ordered monodispersed layer. FET devices incorporating the stripes showed high performance with a mobility of 38 cm$^2$v$^{-1}$s$^{-1}$ and on/off ratio of 2.2×10$^6$ at a 9 μm channel length.

Results and Discussion

Two different types of s-SWCNT inks were examined. The first type of ink was processed from arc-discharge SWCNT powders (Nano Lab, Inc.). In this case, the polyfluorene derivative poly[(9,9-dioctylfluorenyl-2,7-diyl)-alt-co-(6,6'-{2,2'-bipyridine})] (PFO-BPy), was employed as a semiconductor-selective polymer. PFO-BPy has been shown to selectively wrap highly semiconducting SWCNT species. (See, Mistry, K. S.; Larsen, B. A.; Blackburn, J. L. High-Yield Dispersions of Large-Diameter Semiconducting Single-Walled Carbon Nanotubes with Tunable Narrow Chirality Distributions. *ACS Nano* 2013, 7, 2231-2239.) The arc-discharge powder and PFO-BPy were dispersed in toluene by ultrasonication where the PFO-BPy wrapped s-SWCNTs were solubilized, while leaving the remaining carbon residuals and m-SWCNTs in large bundles and aggregates, which were removed by centrifugation. Absorption spectra of the sorted and unsorted SWCNT solutions were obtained for comparison. Metallic peaks present in the unsorted spectra around 700 nm were absent after sorting with PFO-BPy. Following the initial sorting process excess polymer chains were removed by repeated dispersion and centrifugation of the SWCNTs in tetrahydrofuran. The second type of ink was processed from high pressure carbon monoxide (HiPco) produced powders (Nanointegris Inc.). In this case the polyfluorene derivative poly[(9,9-di-n-octylfluorenyl-2,7-diyl)] (PFO) was used as a semiconductor-selective polymer. (See, Nish, A.; Hwang, J. Y.; Doig, J.; Nicholas, R. J. Highly selective dispersion of single-walled carbon nanotubes using aromatic polymers. *Nat. Nanotechnol.* 2007, 2, 640-6.)

FIG. 1 is a schematic illustration of the method. A 2 µl dose of >99.9% purified arc discharge s-SWCNT ink in chloroform (concentration=10 µg ml$^{-1}$) was dropped onto the water surface 0.5 cm away from the vertically oriented substrate as shown in panel (i) of FIG. 1. The dose covered the water surface by spreading at the air/water interface and reached the substrate quickly as a result of surface tension effects (panel (ii) in FIG. 1). Chloroform was chosen as a suitable solvent for this study as it spreads and evaporates rapidly across the water surface.

It should be noted that unlike previous studies on evaporative self-assembly from aqueous solutions of SWCNTs where low pressure was required to speed up the evaporation of water and hence the assembly process, the use of high vapor pressure organic solvents in this example allows for much more rapid assembly under ambient conditions. For example, a deposition velocity of 5 mm min$^{-1}$ at ambient conditions is demonstrated here. Reported deposition velocities using standard evaporative self-assembly from aqueous solution are much slower, only 0.02 and 0.001 mm min$^{-1}$ at 70 and 760 Torr, respectively, using similar substrate dimensions. As the organic ink spreads, it comes in contact with the partially submerged substrate. Subsequent rapid evaporation of the chloroform (FIG. 1, panel(ii)) results in the formation of a stripe of aligned s-SWCNTs on the vertically submerged substrate. As the solvent level rapidly decreases during evaporation, the s-SWCNTs tend to orient perpendicular to the evaporation front, which is sterically a more favored position.

Figure 2:
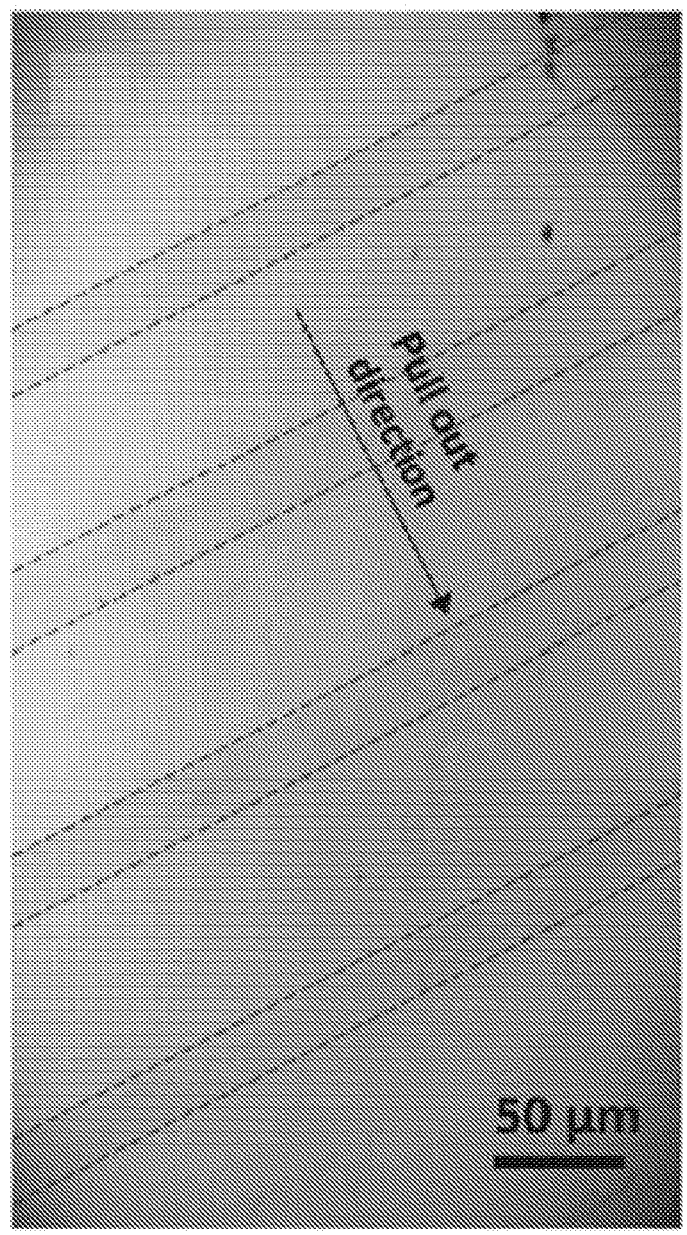
FIG. 2. Optical microscope image of narrow films (stripes) of s-SWCNTs.

The results of these experiments showed the formation of continuous stripes of aligned s-SWCNTs (FIG. 1, panels (iii) and (iv)) and demonstrated the ability to control three pivotal factors: (1) the width of the stripes, (2) the density of SWCNTs within each stripe, and (3) the spacing between the stripes. Control over the width of the stripes by varying the substrate elevation velocity was demonstrated. For a dose concentration of 10 µg ml$^{-1}$, at a high velocity of 9 mm min$^{-1}$ the SWCNTs became randomly disordered while at 1 mm min$^{-1}$ they began to aggregate into large bundles or ropes. At an optimized velocity of 5 mm min$^{-1}$, the s-SWCNTs in the resulting stripes were well isolated from one-another and well aligned. FIG. 2 shows an optical micrograph of aligned s-SWCNT stripes with widths of 20 (±2.5) µm fabricated under these optimized conditions. By optimizing the elevation velocity the width of the stripes could be dictated. Another crucial factor for scalable electronics is controlling the stripe spacing. To demonstrate periodic stripe spacing, a constant substrate elevation velocity of 5 mm min$^{-1}$ was set and one dose per 1.2 sec was applied to achieve a stripe periodicity of 100 µm (FIG. 2). With this method it is possible to fabricate aligned SWCNT arrays with control over the stripe width, stripe periodicity, and SWCNT density, in a continuous manner, which makes this appealing for high throughput microelectronic applications. The substrates used here were treated with a Piranha solution of H$_2$O$_2$ (33%)/concentrated H$_2$SO$_4$ (67%) followed by vapor deposition of a hexamethyldisilizane self-assembling monolayer to increase the hydrophobicity of the SiO$_2$ surface. Unlike previous studies on evaporative self-assembly from aqueous solutions of SWCNTs, which worked well on hydrophilic substrates, this method using organic solutions gave the best results on HMDS treated substrates. HMDS treated substrates may be advantageous for TFT devices as they lead to lower charged impurity concentrations.

Figure 3:
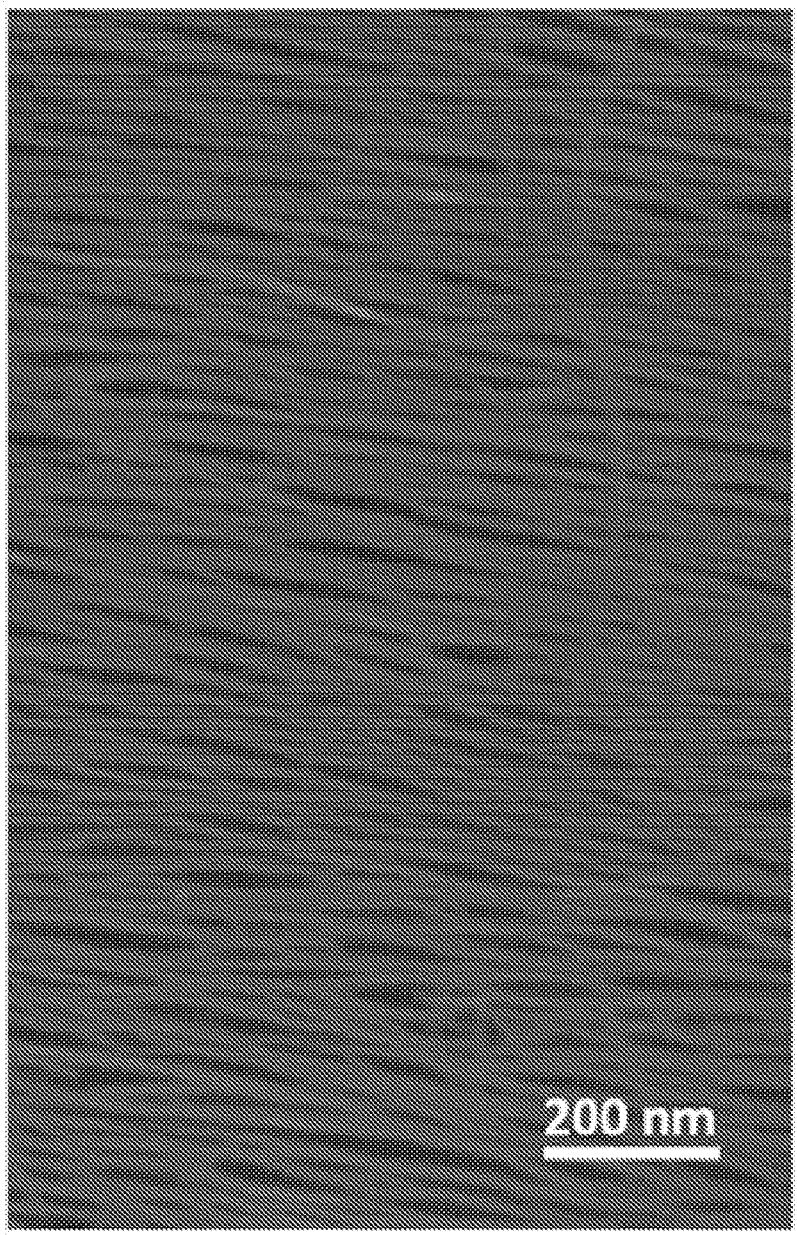
FIG. 3. High resolution SEM image of stripes of s-SWCNTs.
Figure 4B:
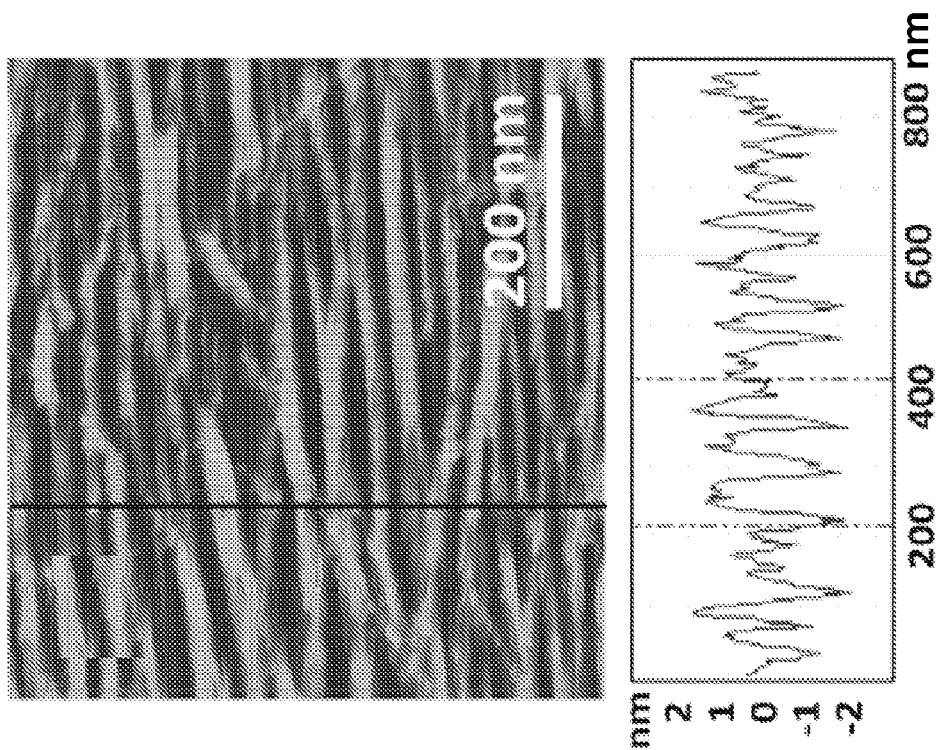
FIGS. 4(A) and (B) AFM images of stripes of s-SWCNTs.
Figure 4A:
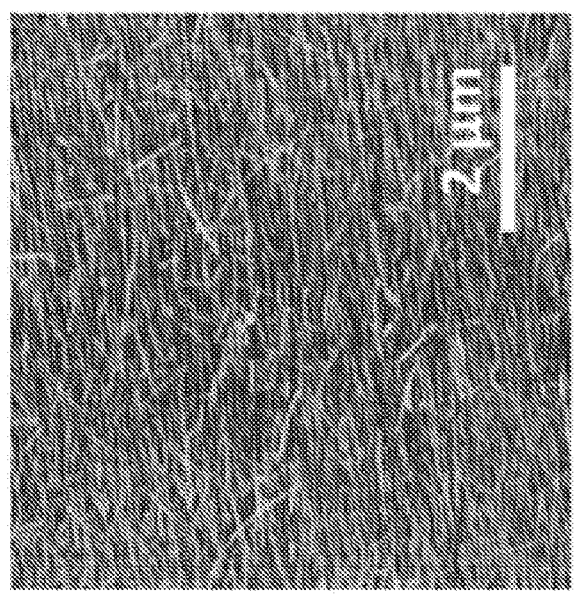

In the higher resolution SEM and AFM images in FIGS. 3, 4(A) and 4(B), the degree of alignment of the arc-discharge s-SWCNTs was notably higher than observed for Langmuir-Blodgett and spin casting methods. (See, LeMieux, M. C.; Roberts, M.; Barman, S.; Jin, Y. W.; Kim, J. M.; Bao, Z. Self-sorted, aligned nanotube networks for thin-film transistors. *Science* 2008, 321, 101-4 and Cao, Q.; Han, S. J.; Tulevski, G. S.; Zhu, Y.; Lu, D. D.; Haensch, W. Arrays of single-walled carbon nanotubes with full surface coverage for high-performance electronics. *Nat. Nanotechnol.* 2013, 8, 180-6.) This is quantified in more detail via Raman spectroscopy, below. SEM images were used to quantify a linear packing density of 40-50 tubes µm$^{-1}$. The packing density achieved here is in-between the relatively lower densities achieved from aqueous self-assembly (~20 tubes µm$^{-1}$), and higher values achieved using Langmuir-Blodgett and Langmuir-Schaefer methods (>100 tubes µm$^{-1}$). (See, Shastry, T. A.; Seo, J. W.; Lopez, J. J.; Arnold, H. N.; Kelter, J. Z.; Sangwan, V. K.; Lauhon, L. J.; Marks, T. J.; Hersam, M. C. Large-area, electronically monodisperse, aligned single-walled carbon nanotube thin films fabricated by evaporation-driven self-assembly. *Small* 2013, 9, 45-51; Cao, Q.; Han, S. J.; Tulevski, G. S.; Zhu, Y.; Lu, D. D.; Haensch, W. Arrays of single-walled carbon nanotubes with full surface coverage for high-performance electronics. *Nat. Nanotechnol.* 2013, 8, 180-6 and Li, X.; Zhang, L.; Wang, X.; Shimoyama, I.; Sun, X.; Seo, W. S.; Dai, H. Langmuir-Blodgett assembly of densely aligned single-walled carbon nanotubes from bulk materials. *J. Am. Chem. Soc.* 2007, 129, 4890-1.) In addition, the thickness of the stripes was <3 nm indicating that the s-SWCNTs were deposited as monolayers or bilayers of SWCNTs over the entire line section.

Figure 5:
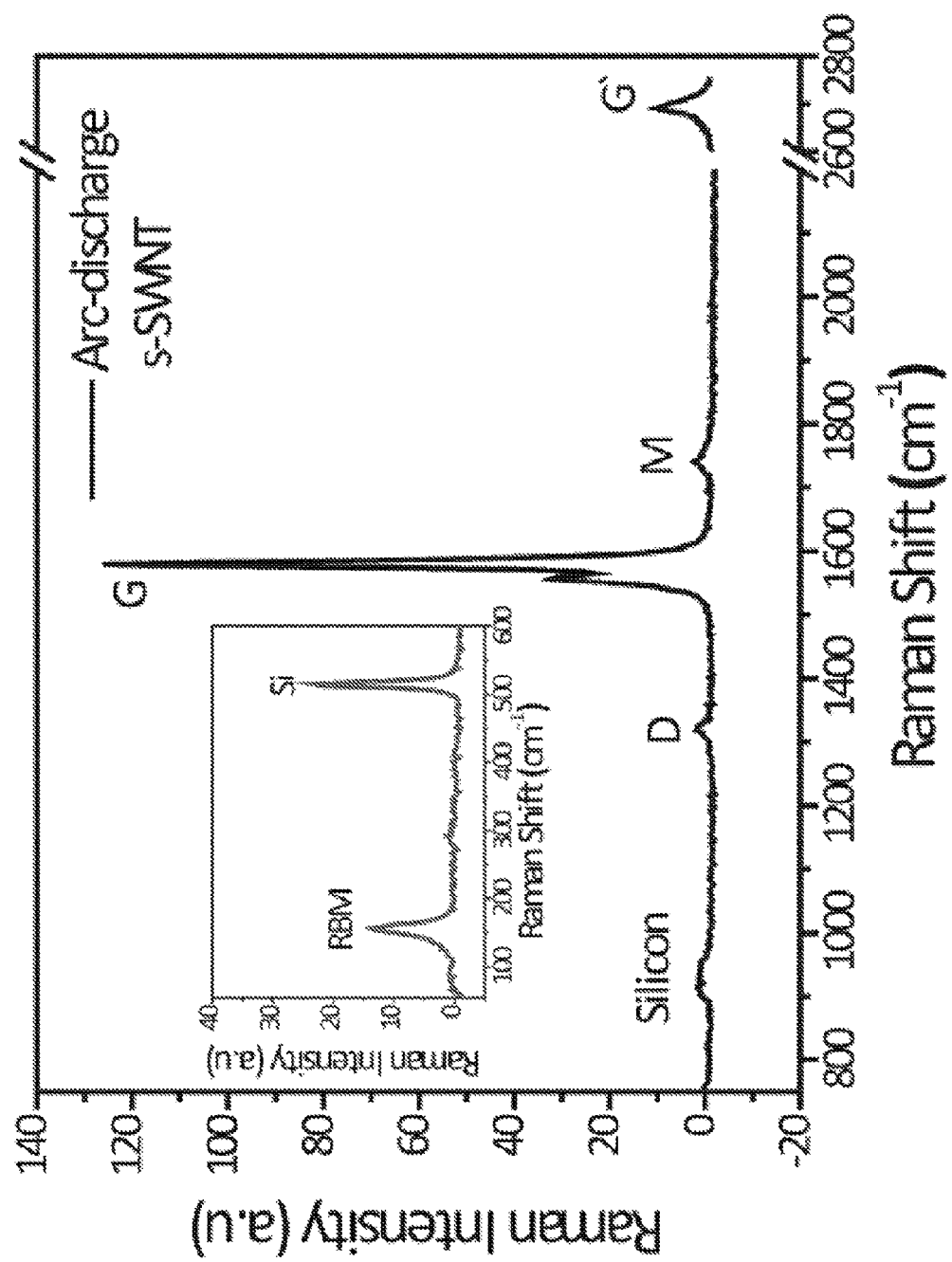
FIG. 5. Raman spectra of arc-discharge SWCNTs with an incident 532 nm laser.
Figure 6:
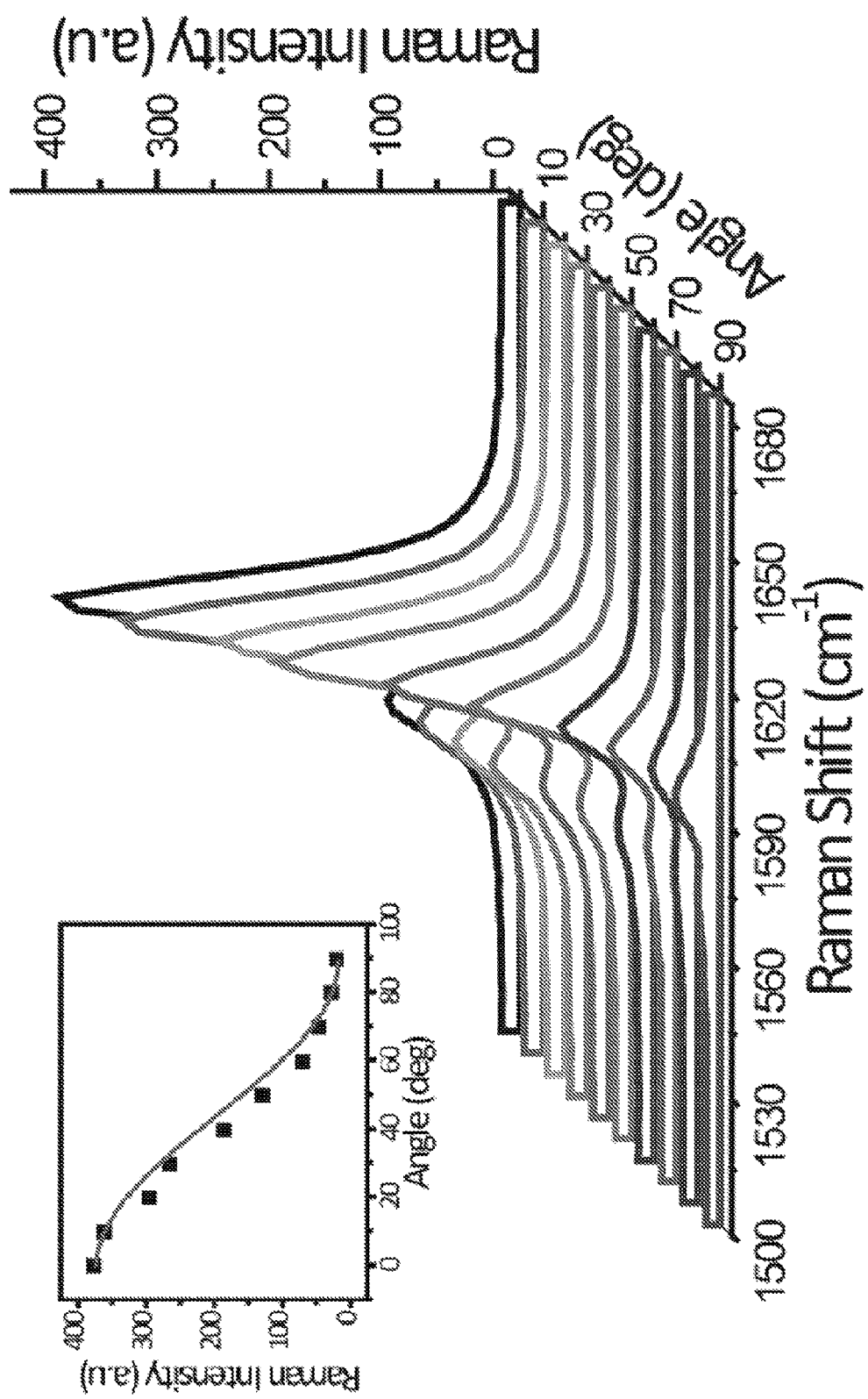
FIG. 6 shows the G-band of s-SWCNT arrays taken at various angles (0°, 10°, 20°, 30°, 40°, 50°, 60°, 70°, 80°, 90°, from back to front) as a function of the angle between the laser polarization and the s-SWCNT stripe long-axis. Inset: angular dependence of the Raman intensity at 1,594 cm$^{-1}$.
Figure 7:
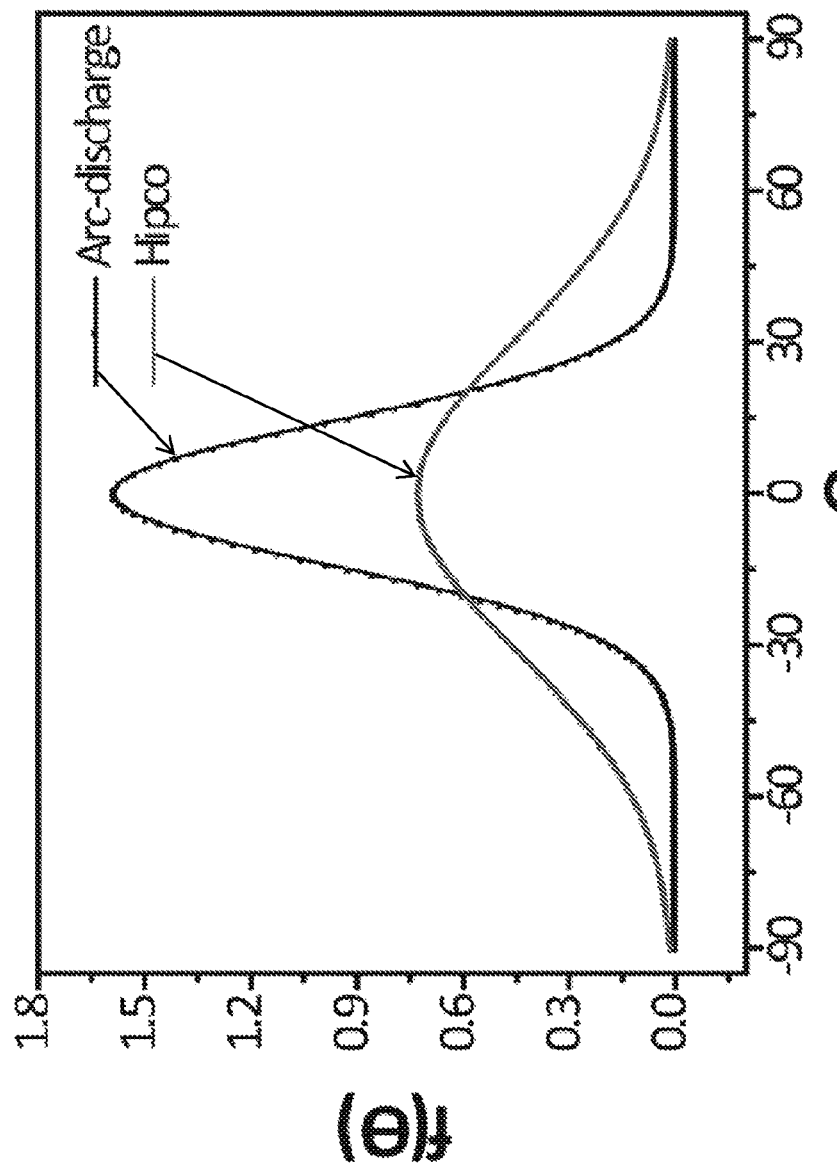
FIG. 7 shows the probability distribution function showing the degree of alignment of arc-discharge and HiPco s-SWCNTs.

Polarized Raman spectroscopy was used to quantify s-SWCNT alignment within each stripe. FIG. 5 shows a representative Raman spectrum from the arc-discharge s-SWCNTs. Present in the spectrum are the radial breathing modes (RBM, near 160 cm$^{-1}$), D-band, G-band, and G'-band modes, and double resonance characteristics associated with the M-band (near 1750 cm$^{-1}$). (See, Brar, V.; Samsonidze, G.; Dresselhaus, M.; Dresselhaus, G.; Saito, R.; Swan, A.; Ünlü, M.; Goldberg, B.; Souza Filho, A.; Jorio, A. Second-order harmonic and combination modes in graphite, single-wall carbon nanotube bundles, and isolated single-wall carbon nanotubes. *Phys. Rev. B* 2002, 66, 155418.) The one-phonon silicon peak at 519 cm$^{-1}$ and two phonon scattering peaks in the range of 900-1100 cm$^{-1}$ were used for calibration and normalization. (See, Temple, P.; Hathaway, C. Multiphonon Raman Spectrum of Silicon. *Phys. Rev. B* 1973, 7, 3685-3697.) The spectrum in the vicinity of the G-band from 1500-1680 cm$^{-1}$ is plotted in FIG. 6 as a function of the angle, δ, between the polarization of the Raman excitation laser and the stripe long-axis. The intensity of the G-band versus δ is plotted in the inset.

The assumption was made that the orientation of the s-SWCNTs within the stripes is described by a Gaussian angular distribution, $$f(\theta) = \exp\left(\frac{-\theta^2}{2\sigma^2}\right), \tag{1}$$

where, f is the probability of finding a s-SWCNT with its long-axis misaligned from the long-axis of the stripe by angle, θ, and σ is the angular width of the distribution. Based on this distribution and using the fact that the Raman G-band for a single s-SWCNT will follow a cos² dependence with the laser polarization, the G-band peak-to-valley ratio for excitation polarized parallel to the stripe versus perpendicular to it, goes as, $$r = \frac{I_G(\delta = 0°)}{I_G(\delta = 90°)} = \frac{\int_{-\pi/2}^{\pi/2} f(\theta)\cos(\theta)^2 \, \partial\theta}{\int_{-\pi/2}^{\pi/2} f(\theta)\cos(\theta - 90°)^2 \, \partial\theta}. \quad (2)$$

(See, Cao, Q.; Han, S. J.; Tulevski, G. S.; Zhu, Y.; Lu, D. D.; Haensch, W. Arrays of single-walled carbon nanotubes with full surface coverage for high-performance electronics. *Nat. Nanotechnol.* 2013, 8, 180-6; Li, X.; Zhang, L.; Wang, X.; Shimoyama, I.; Sun, X.; Seo, W. S.; Dai, H. Langmuir-Blodgett assembly of densely aligned single-walled carbon nanotubes from bulk materials. *J. Am. Chem. Soc.* 2007, 129, 4890-1; Hwang, J.; Gommans, H.; Ugawa, A.; Tashiro, H.; Haggenmueller, R.; Winey, K. I.; Fischer, J. E.; Tanner, D.; Rinzler, A. Polarized spectroscopy of aligned single-wall carbon nanotubes. *Departmental Papers (MSE)* 2000, 87 and Pint, C. L.; Xu, Y.-Q.; Moghazy, S.; Cherukuri, T.; Alvarez, N. T.; Haroz, E. H.; Mahzooni, S.; Doorn, S. K.; Kono, J.; Pasquali, M. Dry contact transfer printing of aligned carbon nanotube patterns and characterization of their optical properties for diameter distribution and alignment. *ACS Nano* 2010, 4, 1131-1145.)

Figure 8:
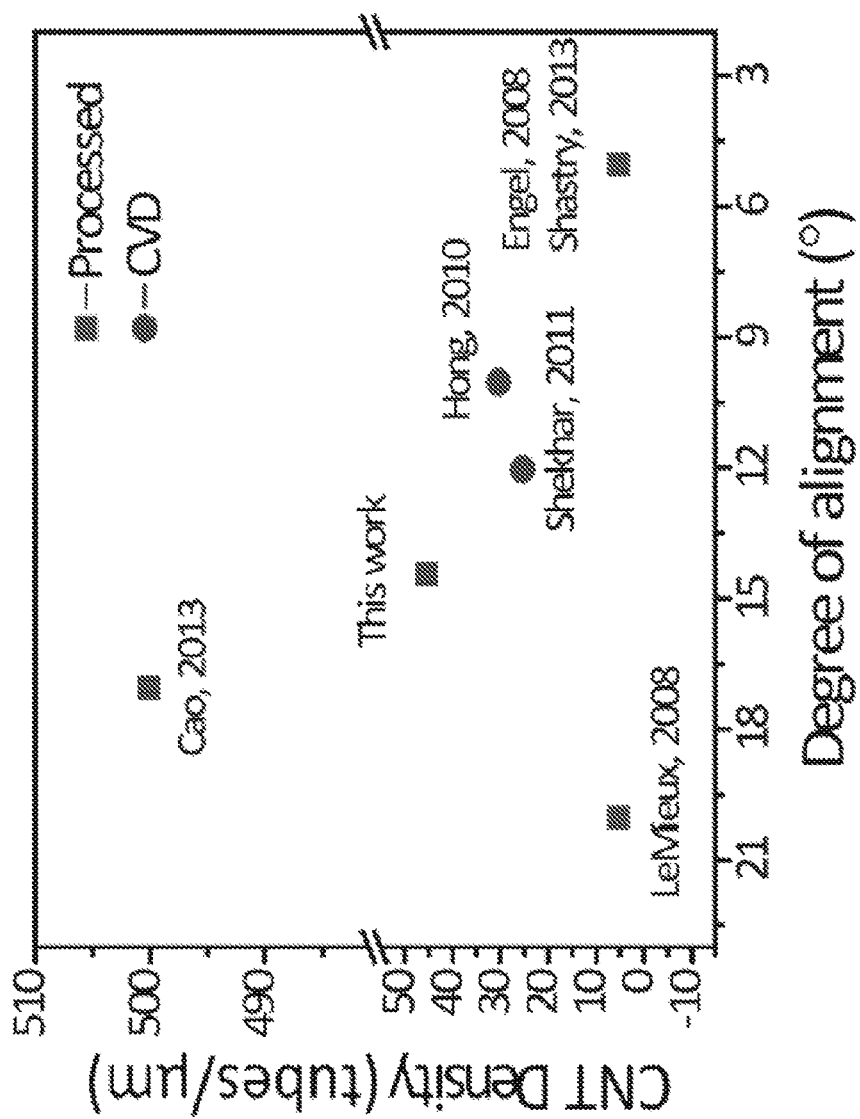
FIG. 8 shows the comparison of dose-controlled, floating evaporative self-assembly aligned SWCNTs (this work) with other methods reported in the literature. CVD growth was used for the circles (metallic and semiconducting SWCNT are mixed) and post synthesis assembly was utilized for the squares.

The r for both types of s-SWCNTs aligned by this method was measured. For s-SWCNTs of diameter 0.8-1.1 nm produced by the HiPco method, r=15.8 corresponding to σ=31°. For s-SWCNTs of diameter 1.3-1.7 nm produced by the arc-discharge method, r=3.47 corresponding to σ=14.41°. The degree of alignment of arc-discharge s-SWCNTs was significantly better than HiPco s-SWCNTs likely because the arc-discharge s-SWCNTs were stiffer (due to their larger diameter). The average length of the arc-discharge and HiPco s-SWCNTs were 464.6 and 449.1 nm, respectively, as determined by AFM. The similarity in length suggests that the improved alignment of the arc-discharge SWCNTs may be solely a result of the structural rigidity. Alignment imperfections existed in both HiPco- and arc-discharge s-SWCNT assemblies, which included voids, bending defects, and randomly oriented SWCNTs. However, defects due to bending and looping of nanotubes were associated more with HiPco s-SWCNTs. The degree of alignment of the arc-discharge s-SWCNTs here is compared to other reported methods with comparable s-SWCNT densities in FIG. 8. The data in the figure are taken from Shastry 2013 (Shastry, T. A.; Seo, J. W.; Lopez, J. J.; Arnold, H. N.; Kelter, J. Z.; Sangwan, V. K.; Lauhon, L. J.; Marks, T. J.; Hersam, M. C. Large-area, electronically monodisperse, aligned single-walled carbon nanotube thin films fabricated by evaporation-driven self-assembly. *Small* 2013, 9, 45-51) Lemieux 2008 (LeMieux, M. C.; Roberts, M.; Barman, S.; Jin, Y. W.; Kim, J. M.; Bao, Z. Self-sorted, aligned nanotube networks for thin-film transistors. *Science* 2008, 321, 101-4), Cao 2013 (Cao, Q.; Han, S. J.; Tulevski, G. S.; Zhu, Y.; Lu, D. D.; Haensch, W. Arrays of single-walled carbon nanotubes with full surface coverage for high-performance electronics. *Nat. Nanotechnol.* 2013, 8, 180-6), Shekhar 2011 (Shekhar, S.; Stokes, P.; Khondaker, S. I. Ultrahigh density alignment of carbon nanotube arrays by dielectrophoresis. *ACS Nano* 2011, 5, 1739-46), Engel 2008 (Engel, M.; Small, J. P.; Steiner, M.; Freitag, M.; Green, A. A.; Hersam, M. C.; Avouris, P. Thin Film Nanotube Transistors Based on Self-Assembled, Aligned, Semiconducting Carbon Nanotube Arrays. *ACS Nano* 2008, 2, 2445-2452) and Hong 2010 (Hong, S. W.; Banks, T.; Rogers, J. A. Improved Density in Aligned Arrays of Single-Walled Carbon Nanotubes by Sequential Chemical Vapor Deposition on Quartz. *Adv. Mater.* 2010, 22, 1826-1830).

Figure 9:
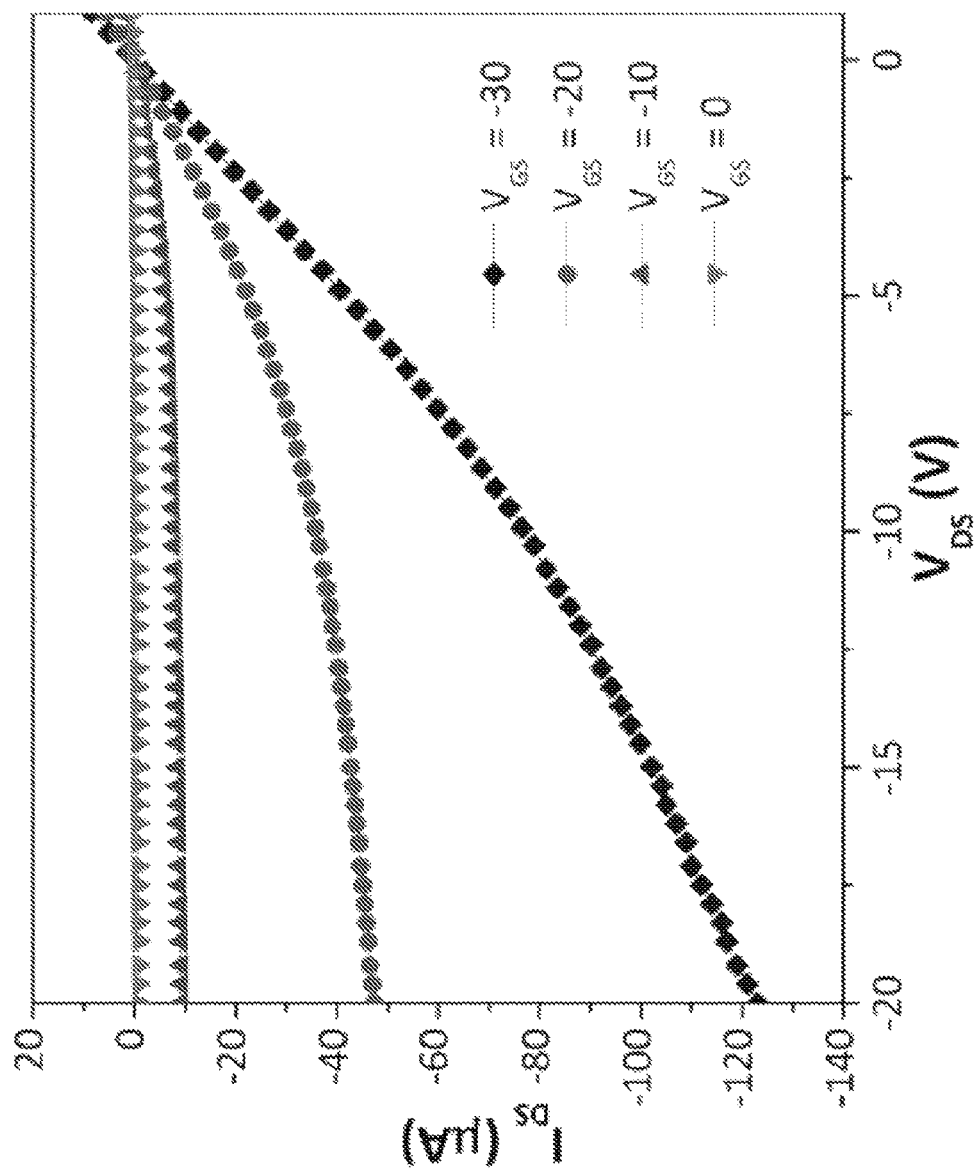
FIG. 9. Output characteristics at varying gate voltages demonstrating the p-type behavior of a s-SWCNT film in a typical FET (L=9 μm, w=4 μm).
Figure 10:
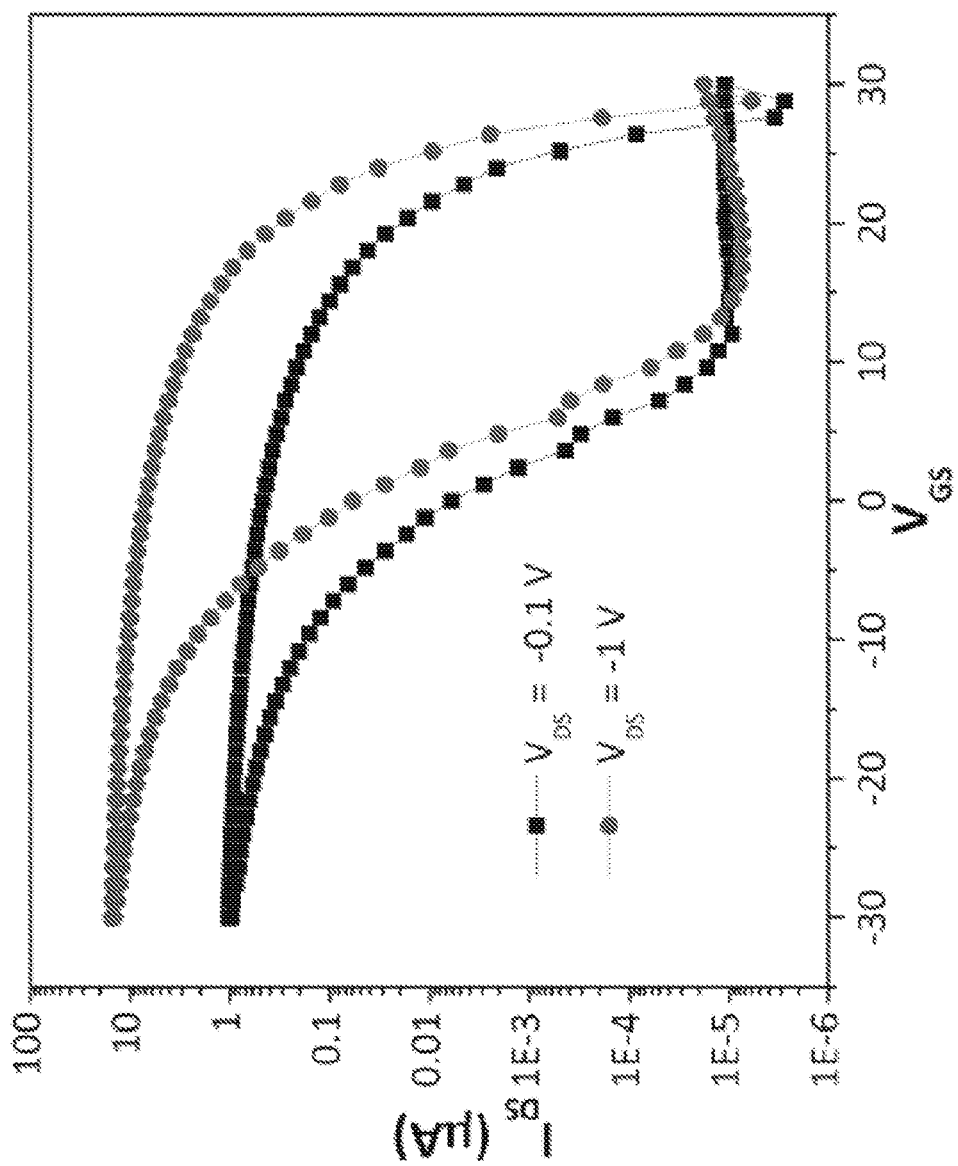
FIG. 10. Transfer characteristics demonstrating a on/off ratio of greater than $10^6$ and high current output for the typical FET.
Figure 11:
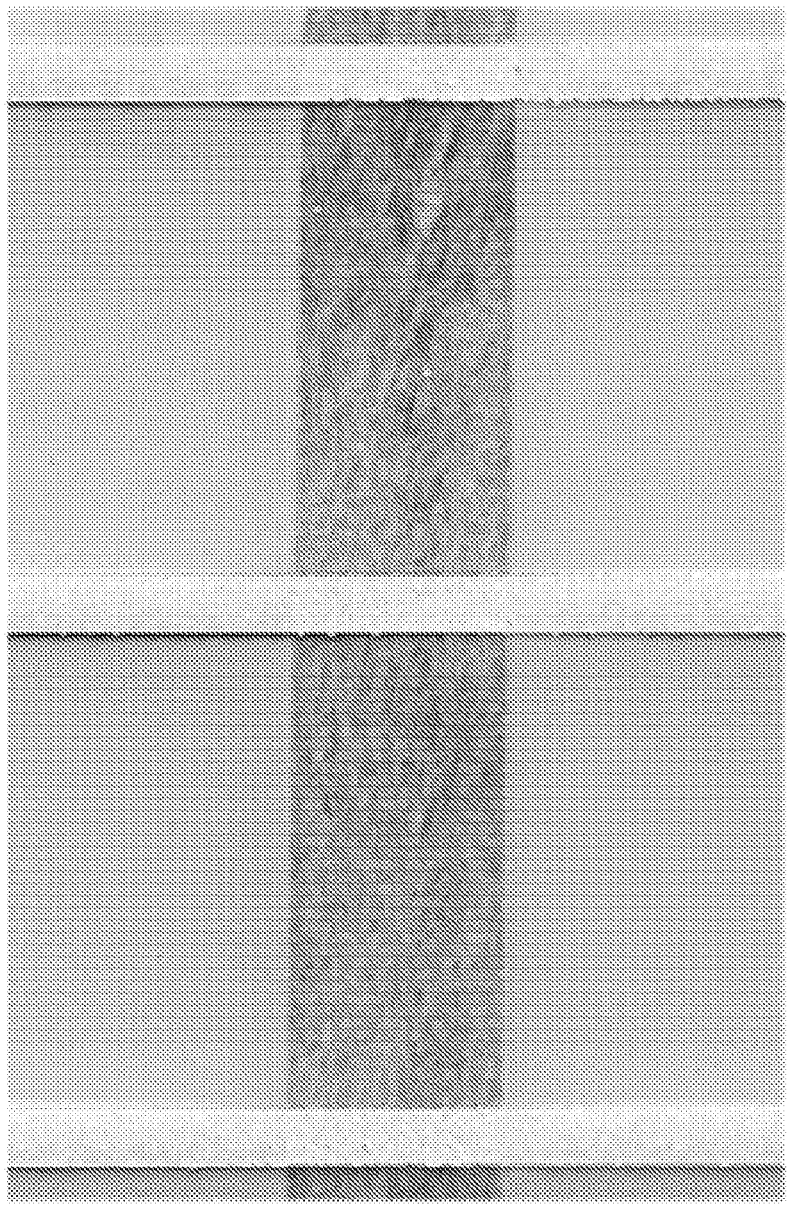
FIG. 11. SEM image of an aligned s-SWCNT-based transistor. Scale bar is 2 μm.

The high electronic-grade purity and the high degree of alignment are both attractive for electronic devices based on s-SWCNTs. As a proof-of-principal, s-SWCNT FETs were fabricated and their charge transport mobility and conductance modulation were evaluated. FIG. 9 shows the output characteristics of a typical 9 µm channel length device (FIG. 11) that has p-type behavior, which is expected for CNT FETs measured in atmosphere. The transfer characteristics shown in FIG. 10, demonstrate the excellent semiconducting nature of the aligned SWCNTs. At a source-drain bias, $V_{DS}$=−1 V, the conductance per width and on/off conductance modulation are 4.0 µS µm$^{-1}$ and 2.2×10$^6$, respectively (FIG. 10). The field-effect mobility was extracted using a parallel plate capacitance model, according to µ= $gL/V_{DS}C_{ox}W$, where g is the transconductance and L and W are the channel length and width, respectively. The mobility achieved here was 38 cm$^2$V$^{-1}$s$^{-1}$. The performance of the FETs were compared to those of Sangwan et al., who achieved simultaneous high on/off ratio and conductance modulation. (See, Sangwan, V. K.; Ortiz, R. P.; Alaboson, J. M. P.; Emery, J. D.; Bedzyk, M. J.; Lauhon, L. J.; Marks, T. J.; Hersam, M. C. Fundamental Performance Limits of Carbon Nanotube Thin-Film Transistors Achieved Using Hybrid Molecular Dielectrics. *ACS Nano* 2012, 6, 7480-7488.) Compared to the 10 µm channel length devices of Sangwan et al., a similar on-conductance per width was achieved but over 10× higher on/off conductance modulation. Sangwan et al. achieved on/off conductance modulation similar to that reported here at a channel length of ~50 µm; however, the on-conductance per width dropped to 10× smaller than that for the present FET.

In conclusion, well-aligned arrays of highly electronic-type sorted semiconducting single-walled carbon nanotubes (s-SWCNTs) were fabricated using dose-controlled, floating evaporative self-assembly, by exploiting the spreading of chloroform at the air/water interface of a trough. The rapidly evaporating chloroform front aided in the alignment of the tubes under ambient conditions, on the partially submerged substrate at the air/water interface. The use of timed doses of predetermined aliquots of solution to control the position and/or periodicity of the stripes makes this an attractive cost-effective large area fabrication process for creating functional s-SWCNT architectures.

Experimental Section

Preparation of Semiconducting SWCNTs:

Arc-discharge: Mixtures of arc-discharge SWCNT powders (2 mg ml$^{-1}$) and PFO-BPy (American Dye Source, 2 mg ml$^{-1}$) were sonicated for 30 min in toluene (30 ml). The solution was centrifuged in a swing bucket rotor at 50,000 g for 5 min, and again at 50,000 g for 1 hr. The supernatant was collected and filtered through a syringe filter. A distillation removed toluene over a 30 min duration. The residue of PFO-BPy and s-SWCNTs were redispersed in tetrahydrofuran (THF). The s-SWCNT solution in THF was centrifuged at a temperature of 15° C. for 12 hours. The supernatant (excess PFO-BPy) was discarded and the pellet was redispersed into THF. After removing the THF, the residue was dispersed in chloroform to a concentration of 10 µg ml$^{-1}$.

HiPco: The initial dispersion of HiPco (Nanointegris Inc.) SWCNTs were prepared using 2 mg ml$^{-1}$ of HiPco powder and 2 mg ml$^{-1}$ of PFO (American Dye Source) in toluene. The same sonication, centrifugation, and distillation procedures as the arc-discharge SWCNTs were used for the dispersion of s-SWCNTs, separation of unwanted material, and removal of excess polymer.

Raman spectroscopy characterization: Raman characterization was measured in a confocal Raman microscope with laser excitation wavelength of 532 nm (Aramis Horiba Jobin Yvon Confocal Raman Microscope.). The device was equipped with a linear polarizing filter between the sample and the incident beam laser to allow polarization-dependent measurements.

Imaging: SEM images were collected with LEO-1530 field-emission scanning electron microscope (FE-SEM). The surface morphology of the s-SWCNTs was imaged using a Nanoscope III Multimode atomic force microscope (Digital Instruments). Tapping mode was utilized for the AFM measurement. A triangular cantilever with an integral pyramidal Si$_3$N$_4$ tip was used. The typical imaging force was of the order of 10$^{-9}$ N.

Langmuir-Blodgett trough and substrate: The LB trough (KSV NIMA Medium size KN 2002) was primarily used as a trough to spread s-SWCNTs at 23° C. with Wilhelmy balance (Platinum plate). Milli Q water (resistively ca. 18.2 MΩ cm) was used as the water sub-phase. The Si/SiO$_2$ substrates were cleaned by a Piranha solution of H$_2$O$_2$ (33%)/concentrated H$_2$SO$_4$ (67%) for 20 min and rinsed with deionized (DI) water. After Piranha treatment, the substrates were covered by a hexamethyldisilizane self-assembling monolayer (vapor deposition).

FET Fabrication: First, stripes of arc-discharge s-SWCNTs were deposited on a highly doped Si substrate with a 90 nm thermally grown SiO$_2$, which served as the backgate electrode and dielectric, respectively. Electron beam lithography was then used to pattern the stripes so that they had well-defined widths of 4 μm. Samples were then annealed in a mixture of ≥99.999% Ar (95%):H$_2$ (5%) in order to partially degrade the PFO-BPy polymer, followed by annealing in vacuum at 1×10$^{-7}$ Torr and 400° C. for 20 min. A second electron beam lithography step was used to define the top-contacted electrodes. Thermal deposition of Pd (40 nm) was used to create source and drain contacts to the s-SWCNT stripe. Finally, the devices were annealed in argon atmosphere at 225° C.

Example 2

This example illustrates the performance of exceptionally electronic-type sorted, aligned s-SWCNTs in field effect transistors. High on-conductance and high on/off conductance modulation are simultaneously achieved at channel lengths that are both shorter and longer than individual s-SWCNTs. The s-SWCNTs were isolated from heterogeneous mixtures of s-SWCNTs and m-SWCNTs using a polyfluorene-derivative as a semiconductor selective agent and aligned on substrates via dose-controlled, floating evaporative self-assembly.

Example 1 illustrates that s-SWCNTs isolated from polydisperse mixtures of SWCNTs using the polyfluorene-derivative poly[(9,9-dioctylfluorenyl-2,7-diyl)-alt-co-(6,6'-{2,2'-bipyridine})] (PFO-BPy) as a sorting agent can be aligned on substrates via dose-controlled, floating evaporative self-assembly. This example evaluates the performance of these aligned s-SWCNTs as channel materials in FETs and reports exceptionally high on/off conductance modulation and on-conductance, over a range of channel lengths, compared to previous reported studies.

High purity s-SWCNTs were extracted from an as-produced arc discharge synthesized SWCNT powder purchased from NanoLab Inc. s-SWCNTs were isolated by dispersing the powder in a solution of PFO-BPy in toluene adapting procedures reported by Mistry et al. During the initial dispersion process the polymer selectively wraps and solubilizes predominantly semiconducting species. Excess polymer was removed by dispersing the s-SWCNTs in tetrahydrofuran followed by repeated sedimentation and dispersion cycles, which effectively removed polymer chains that were not tightly bound to the s-SWCNT surface. Removing excess polymer improved the self-assembly of aligned s-SWCNT arrays and improved the contact of s-SWCNT to metal electrodes in FETs for higher performance.

Optical absorption spectra of sorted and unsorted PFO-BPy SWCNT solutions were obtained for comparison. In both the sorted and unsorted spectra the $S_{22}$ optical transitions were broadened around a wavelength of 1050 nm due to the overlap of peaks from a chiral distribution of s-SWCNTs with diameters 1.3-1.7 nm. Previous investigations have used photoluminescence and Raman spectroscopy to confirm that PFO-BPy differentiates by electronic type, but not strongly by diameter, thus resulting in diameter distributions that match the s-SWCNT starting material. The broad $M_{11}$ peak, which is visible in the unsorted spectra is immeasurable after sorting suggesting a purity of >99%. The features from 400-600 nm are combinations of the $S_{33}$ s-SWCNT transitions coupled with absorption from the PFO-BPy, which is centered at 360 nm.

For the FET devices, highly doped Si substrates with a 90 nm thick SiO$_2$ dielectric layer were used as the gate electrode and dielectric, respectively. Prior to s-SWCNT deposition, the substrates were treated with a solution of 20 ml H$_2$SO$_4$:10 ml H$_2$O$_2$ followed by vapor deposition of a hexamethyldisilizane self-assembling monolayer to increase the hydrophobicity of the SiO$_2$ surface. The dose-controlled, floating evaporative self-assembly procedure is described briefly below and in detail in Example 1, above. Droplets ("doses") of a solution of 10 μg ml$^{-1}$ s-SWCNTs in chloroform were cast on a water trough. The s-SWCNTs spread across the surface of the water and deposited on the substrate which was slowly extracted from the trough, normal to the air-water interface. Each droplet created a well-aligned stripe of s-SWCNTs across the entire width of the substrate. Here, periodic arrays of stripes were achieved by successively adding droplets to the through surface at 12 second intervals as the substrate was elevated at a constant rate of 5 mm min$^{-1}$.

Figure 12:
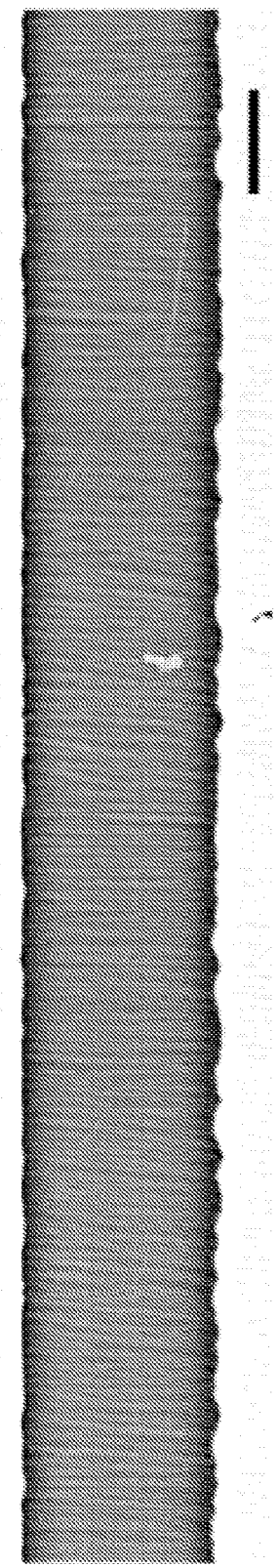
FIG. 12. SEM image (scale bar=200 nm) of a 400 nm channel length FET.
Figure 13:
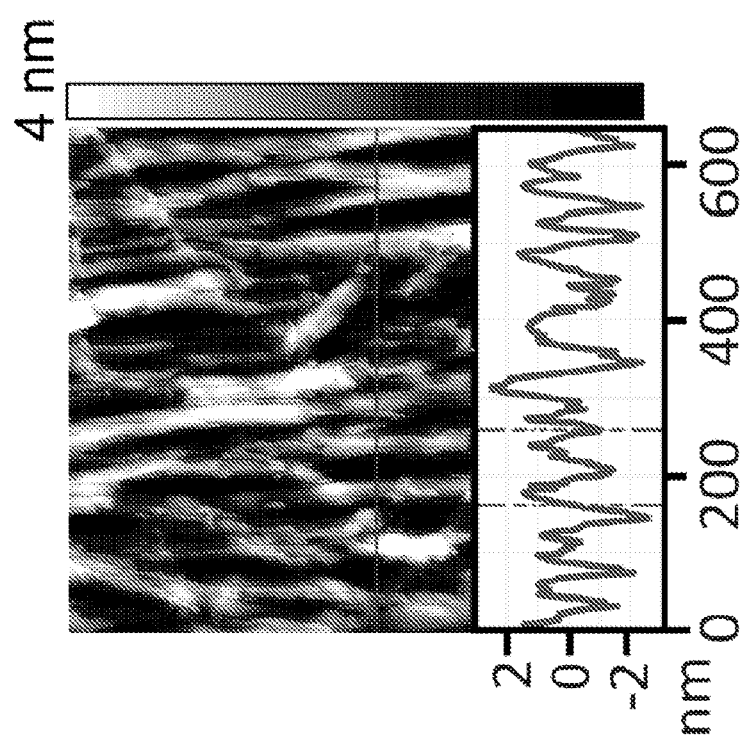
FIG. 13. AFM image of an aligned s-SWCNT stripe. The inset is the film thickness profile along the dark grey cross-section.
Figure 14:
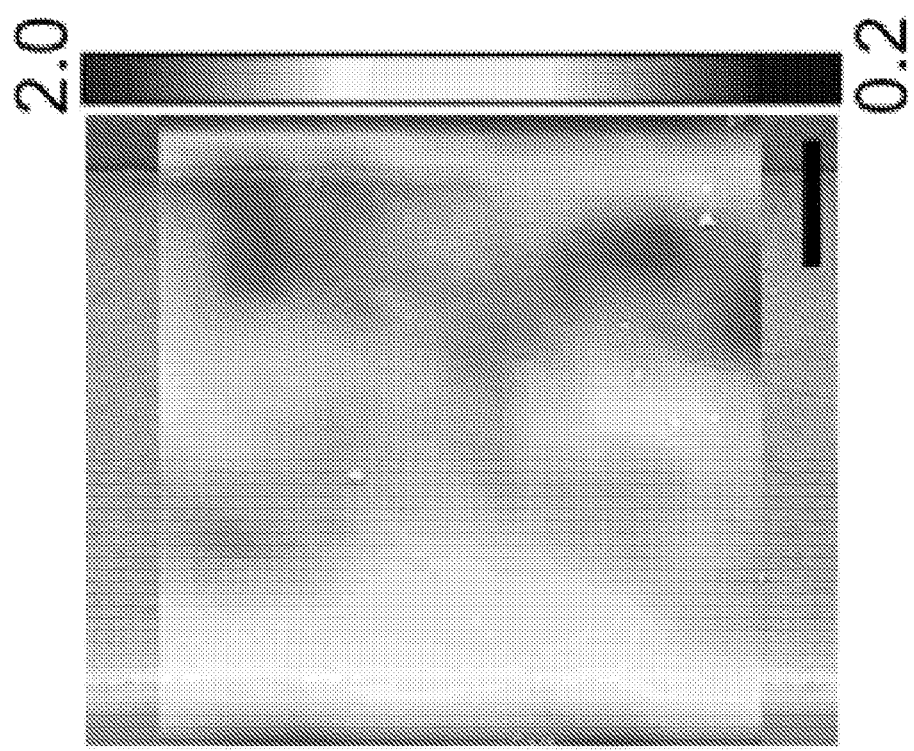
FIG. 14. Raman map of a ~20 μm$^2$ stripe overlaying a corresponding SEM image (scale bar=1 μm). Grayscale bar indicates G-band intensity divided by Si intensity.

The uniformity, density, and thickness of s-SWCNTs in a single stripe were characterized using SEM, AFM and Raman spectroscopy (FIGS. 12, 13 and 14, respectively). The AFM thickness profile shown in FIG. 13 varies between 2-4 nm, indicating for the most part that each stripe is composed of single layers of s-SWCNTs with localized regions of inter-nanotube overlap. The G-band Raman intensity (3 mW, 532 nm) of the s-SWCNTs is spatially mapped for one stripe in FIG. 14, normalized to the substrate Si peak intensity. The G-band intensity varies only by ±12.5% indicating that the density of the s-SWCNTs within each stripe was fairly uniform. SEM images (example presented in FIG. 12) were used to quantify a s-SWCNT linear packing density of 40-50 SWCNTs μm$^{-1}$. These measurements indicated that the stripes were monolayers of well-isolated s-SWCNTs with occasional inter-nanotube overlap from randomly oriented s-SWCNTs that interweave into the well-ordered s-SWCNTs at a linear occurrence of one randomly oriented s-SWCNT per two micrometers. The randomly overlapping nanotubes may be beneficial in establishing inter-SWCNT connectivity in the FET percolation regime where channel length ($L_C$) is much greater than the s-SWCNT length ($L_N$) ($L_C \gg L_N$).

FETs were fabricated from the stripes using electron beam (e-beam) lithography. The stripes varied in width from 10-20 μm. Therefore, they were lithographically patterned to ensure a consistent FET channel width of 4 μm. First, e-beam patterning was used to expose regions around the s-SWCNT stripes where unwanted s-SWCNTs were to be removed and etching via a 20 s exposure to an oxygen plasma (50 W, 10 mTorr, and 10 sccm $O_2$ flow rate) was used. To remove PMMA resist, films were developed in acetone and toluene each for 30 minutes at 60° C. and rinsed in isopropyl alcohol. Samples were then annealed in ≥99.999% Ar (95%):$H_2$ (5%) at 500° C. to partially remove and decompose the PFO-BPy. An additional annealing step was conducted in high vacuum at 1×10$^{-7}$ Torr at 400° C. for 20 minutes to further degrade and partially remove polymer residue. A second e-beam step defined the source-drain electrodes and contact pads. The pattern was developed to remove resist and the underlying electrode pattern was exposed to ultraviolet light in air at a power of 0.1 W cm$^{-2}$ for 90 s (SCD88-9102-02 BHK Inc.) to improve adhesion of Pd to the s-SWCNT surface. Thermal evaporation of a 40 nm thick layer of Pd defined the source-drain electrodes, followed by lift off, which was achieved by soaking samples in acetone at 120° C. for 5 minutes and bath sonication in acetone for 30 seconds. Immediately before measurement the devices were annealed at 225° C. in Ar to improve contact resistance. The resulting device architecture of a 400 nm device is shown in FIG. 12.

Figure 15:
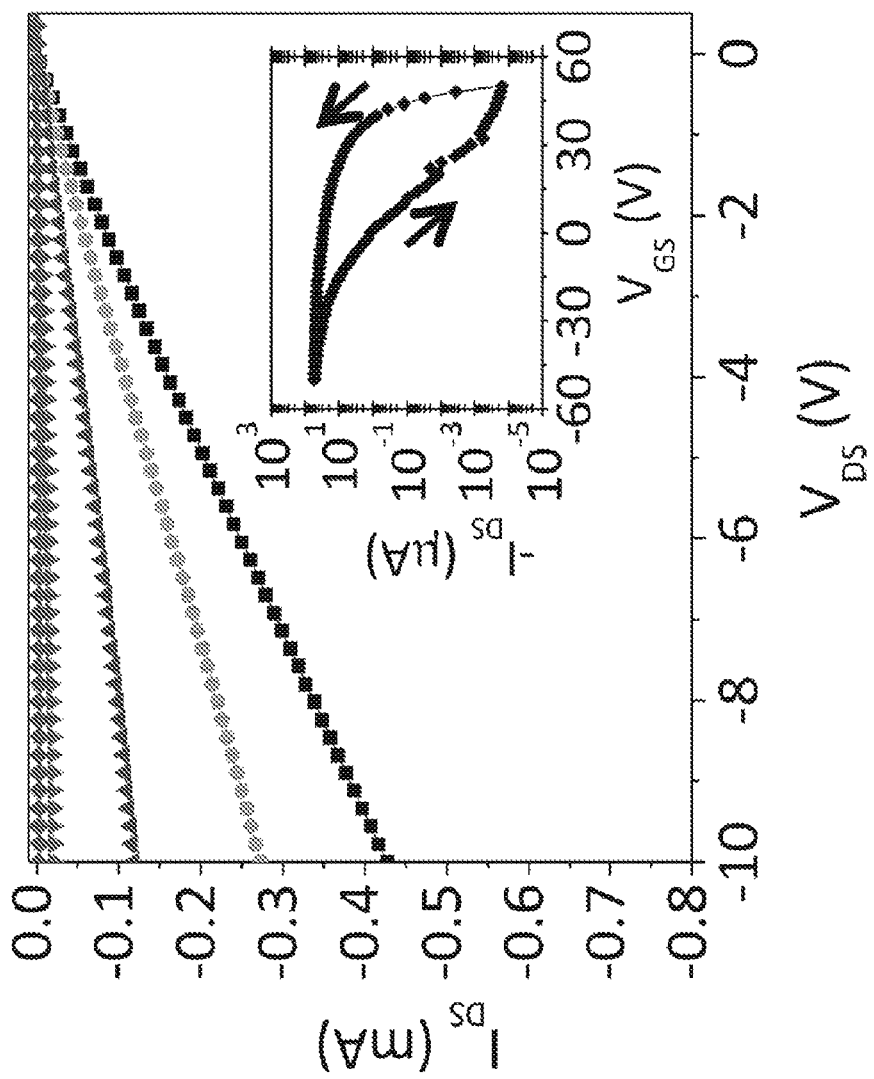
FIG. 15. Output characteristics of a 9 μm channel length FET at $V_{GS}$=−30 V (squares) to 10 V (diamonds) in 10 V increments. The inset shows the forward and backward sweeps of transfer curves at $V_{DS}$=−1 V.

The electronic characteristics of s-SWCNT channel FETs were measured using a Keithley source meter instrument (Model 2636A). Measurements were made on devices of varying channel length in order to quantify transport properties in both the direct and percolative regimes and to assess the electronic-type purity of the s-SWCNTs. The characteristics of a typical 9 μm channel length device (in the percolating regime) are shown in FIG. 15, demonstrating the p-type behavior of the aligned s-SWCNTs. At low fields the current output followed linear behavior indicating ohmic contact at the Pd-SWCNT interface. The transfer characteristics are shown in the insert. Hysteresis typical of SWCNT-based devices that are not treated to remove the surface adsorbates was observed. The on/off ratio of the device was 5×10$^5$. The on-conductance was 7.3 μS μm$^{-1}$, which corresponds to a field-effect mobility of 46 cm$^2$V$^{-1}$s$^{-1}$, applying a standard parallel plate capacitance model:

$$\mu = \left(\frac{L_C t_{ox}}{\epsilon_{SiO_2} V_{SD} W}\right)\left(\frac{dI}{dV_g}\right). \quad (3)$$

Figure 17:
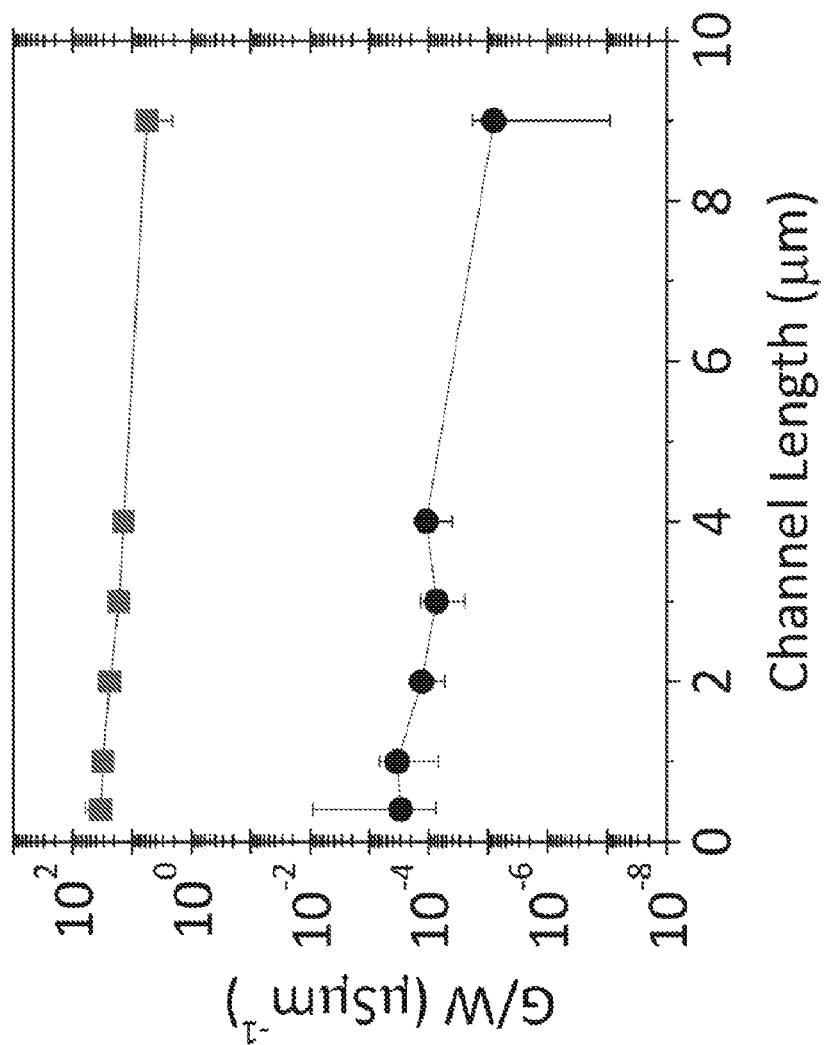
FIG. 17. On-(squares) and off-(circles) conductance at each channel length. Median values are plotted, and the error bars indicate maximum and minimum values.
Figure 18:
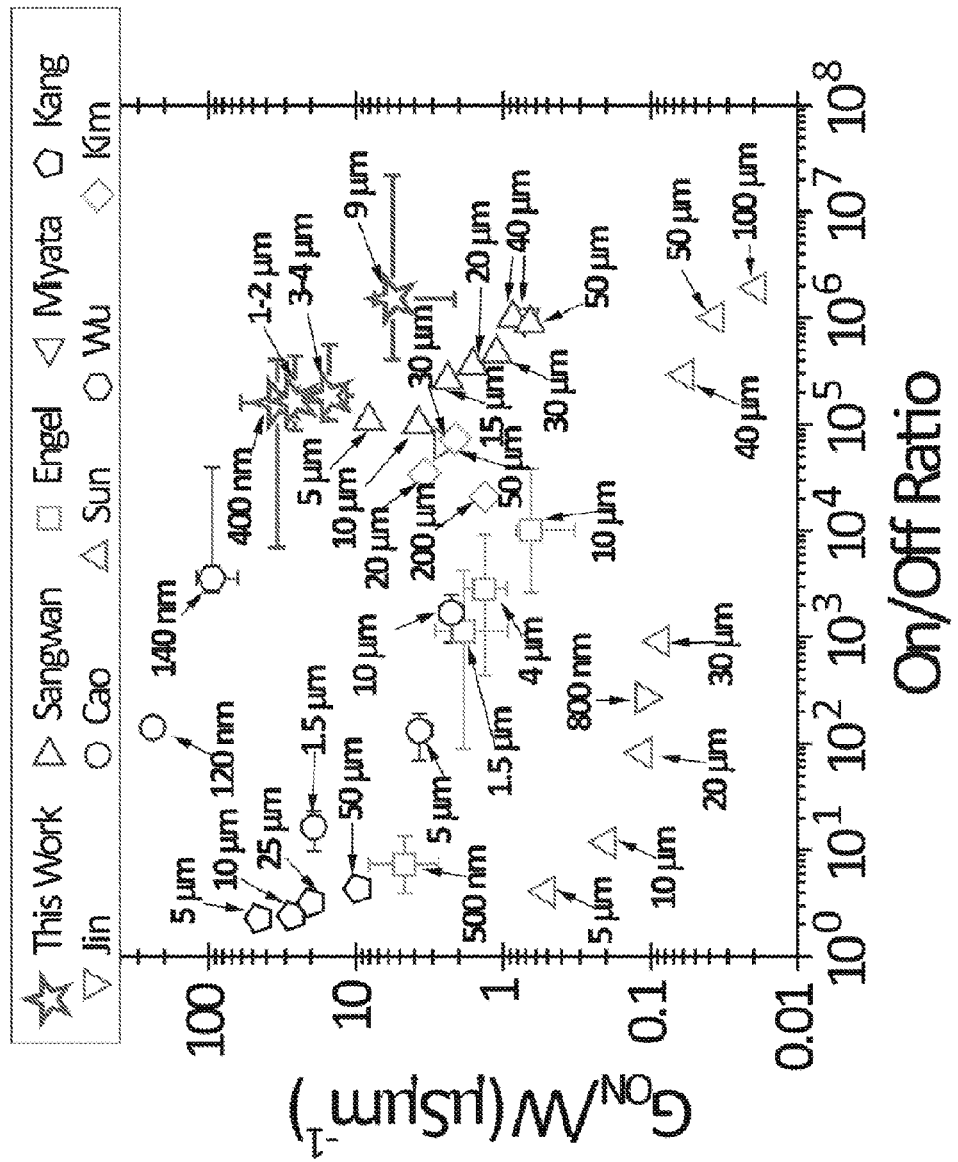
FIG. 18. Comparison of s-SWCNT FET performance (on-conductance per width versus conductance modulation) achieved in Example 2 to previous studies. Median values for this work are plotted as stars and calculated from the following number of devices at each channel length: 400 nm (22 devices), 1-2 μm (6 devices), 3-4 μm (6 devices), and 9 μm (4 devices). Error bars for this work indicate maximum and minimum values.

The on- and off-conductance normalized to width for each device and varying channel lengths of 0.4, 1, 2, 3, 4 and 9 μm are plotted in FIG. 17. The champion devices in order of increasing channel length have on-conductance per width of 61, 31, 24, 18, 16, and 7.5 μS μm$^{-1}$. The highest on/off ratios achieved in order of increasing channel length are 4.1×10$^5$, 4.1×10$^5$, 4.4×10$^5$, 5.6×10$^5$, 3.4×10$^5$, and 2.2×10$^7$. The distribution of on-conductance and on/off ratio of all of the devices tested are compared in FIG. 18 with the performance state-of-the-art s-SWCNT FETs reported in the literature. The prior studies are Sangwan (V. K. Sangwan, R. P. Ortiz, J. M. P. Alaboson, J. D. Emery, M. J. Bedzyk, L. J. Lauhon, T. J. Marks, and M. C. Hersam, ACS Nano 6 (8), 7480 (2012)), Engel (M. Engel, J. P. Small, M. Steiner, M. Freitag, A. A. Green, M. S. Hersam, and P. Avouris, ACS Nano. 2 (12), 2445 (2008)), Miyata (Y. Miyata, K. Shiozawa, Y. Asada, Y. Ohno, R. Kitaura, T. Mizutani, and H. Shinohara, Nano. Research 4 (10), 963 (2011)), Kang (S. J. Kang, C. Kocabas, T. Ozel, M. Shim, N. Pimparkar, M. A. Alam, S. V. Rotkin, and J. A. Rogers, Nat. Nanotechnol. 2 (4), 230 (2007)), Jin (S. H. Jin, S. N. Dunham, J. Song, X. Xie, J. H. Kim, C. Lu, A. Islam, F. Du, J. Kim, J. Felts, Y. Li, F. Xiong, M. A. Wahab, M. Menon, E. Cho, K. L. Grosse, D. J. Lee, H. U. Chung, E. Pop, M. A. Alam, W. P. King, Y. Huang, and J. A. Rogers, Nat. Nanotechnol. 8 (5), 347 (2013)), Cao (Q. Cao, S. J. Han, G. S. Tulevski, Y. Zhu, D. D. Lu, and W. Haensch, Nat. Nanotechnol. 8 (3), 180 (2013)), Sun (D. M. Sun, M. Y. Timmermans, Y. Tian, A. G. Nasibulin, E. I. Kauppinen, S. Kishimoto, T. Mizutani, and Y. Ohno, Nat. Nanotechnol. 6 (3), 156 (2011)), Wu (J. Wu, L. Jiao, A. Antaris, C. L. Choi, L. Xie, Y. Wu, S. Diao, C. Chen, Y. Chen, and H. Dai, Small, n/a (2013)), and Kim (B. Kim, S. Jang, P. L. Prabhumirashi, M. L. Geier, M. C. Hersam, and A. Dodabalapur, App. Phys. Lett. 103 (8), 082119 (2013)).

On-conductance as high as 240 μS μm$^{-1}$ has been reported for SWCNT FETs in the direct transport regime, however, the on/off ratio in such devices was limited to ≤10$^3$, presumably by the presence of metallic nanotubes. Similarly, in the percolative regime, high on/off ratios on the order of 10$^7$ have been achieved, but devices were limited by an on-conductance of ≤4 μS μm$^{-1}$ for channel length of >5 μm. Due to the number of percolation pathways in network s-SWCNT FETs or the low density of s-SWCNTs in aligned CVD films. For example, it has been challenging to achieve high on-conductance and on/off ratio simultaneously in the percolative regime. (See, D. M. Sun, M. Y. Timmermans, Y. Tian, A. G. Nasibulin, E. I. Kauppinen, S. Kishimoto, T. Mizutani, and Y. Ohno, Nat. Nanotechnol. 6 (3), 156 (2011) and S. H. Jin, S. N. Dunham, J. Song, X. Xie, J. H. Kim, C. Lu, A. Islam, F. Du, J. Kim, J. Felts, Y. Li, F. Xiong, M. A. Wahab, M. Menon, E. Cho, K. L. Grosse, D. J. Lee, H. U. Chung, E. Pop, M. A. Alam, W. P. King, Y. Huang, and J. A. Rogers, Nat. Nanotechnol. 8 (5), 347 (2013).)

Here, high on-conductance and high on/off ratio were achieved simultaneously. At a channel length of 400 nm in the direct regime, an on-conductance per width as high as 61 μS μm$^{-1}$ was achieved, while maintaining a median on/off ratio of 2×10$^5$. At a channel length of 9 μm in the percolative regime, a median on/off ratio of 2×10$^6$ was achieved, while reaching conductance values as high as 7.5 μS μm$^{-1}$. At intermediate channel lengths ranging from 1-4 μm the achieved on-conductance and on/off ratio fell in between these two cases along an inversely sloping line in FIG. 18. In general, the performance of the present devices pushes out further to the upper-right corner of the graph in FIG. 18 than any of the other families of devices, extending further in on-conductance and on/off ratio than these previous studies.

Figure 16:
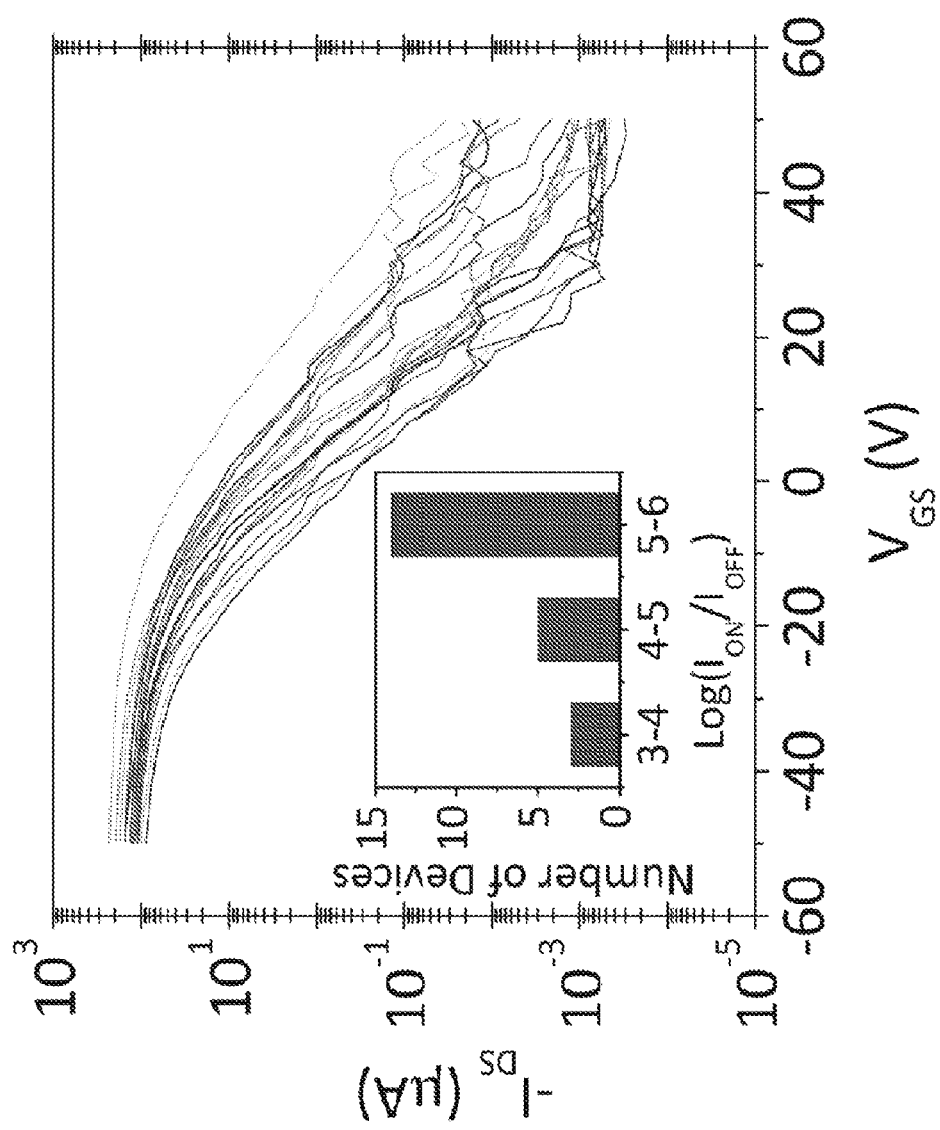
FIG. 16. Transfer characteristics of 22 different 400 nm channel length FET devices at $V_{DS}$=−1 V. The inset is the on/off ratio histogram.

The simultaneously high on-conductances and on/off ratios likely originate from a combination of factors including (a) the high semiconducting purity of the s-SWCNTs and (b) their high degree of alignment. An additional factor may be attributed to (c) a reduction in inter-nanotube charge screening due to the presence of the polymer wrapper during s-SWCNT deposition which reduces s-SWCNT bundling and interactions. To test factor (a), 22 different FET devices with channel lengths of 400 nm were measured. The analysis of the individual s-SWCNT length distribution presented in Example 1 indicated that roughly half of the individual s-SWCNTs were longer than 400 nm. Thus, these 400 nm FETs provided a sensitive measure of the presence of metallic SWCNTs. These FETs were composed of 4,071 individual s-SWCNTs or small pairs or bundles of s-SW-CNTs. The conductance modulation of each FET (FIG. 16) was used to estimate the electronic-type purity of the SWCNTs within the FET, where the presence of even a single metallic nanotube directly spanning the channel will cause a substantial increase in the off-conductance on the order of 1-10 $\mu$S. The median on-conductance was 130 $\mu$S, therefore an on/off ratio for a FET containing a single metallic nanotube that spans the channel was expected to be reduced to the order of $10^1$-$10^2$. Of the devices measured, the lowest on/off ratio was $6.8 \times 10^3$, nearly two orders of magnitude larger than the highest on/off ratio expected for a device containing a single metallic nanotube. The median on/off ratio was $2 \times 10^5$ with only three devices having on/off ratios lower than $10^4$. If half of the 4,071 species were individual SWCNTs that fully span the channel, which is a reasonable estimate based on the measurements of length distributions in Example 1, the semiconducting purity of the sorted SWCNTs here was ≥99.95%.

While factor (b) was confirmed by the SEM images, factor (c) was assessed as follows. The average inter-SWCNT spacing was ~20 nm, and the presence of bundles in solution was minimal due to the high solubility of PFO-BPy s-SWCNTs in chloroform. The stability of the PFO-BPy wrapper around s-SWCNTs may limit inter-SWCNT interactions during drying thereby creating aligned films of s-SWCNTs with less charge screening interactions.

Under the assumption that the individual s-SWCNTs or small pairs or bundles of s-SWCNTs were all individual s-SWCNTs, a conductance as high as 1.2 $\mu$S per s-SWCNT was achieved in the devices of channel length 400 nm. There are several factors that can be tailored to further improve the conductance per tube such as (i) narrowing the diameter distribution and shifting towards larger diameter s-SW-CNTs, (ii) sorting of the s-SWCNTs by length to ensure that they all actually do individually span the channel or alternatively using shorter channel lengths, (iii) implementing a local top gate structure for improved conductance modulation, and (iv) better removal of the PFO-BPy polymer residuals which may increase contact resistance at the SWCNT-Pd interface.

Example 3

In this example, a film comprising aligned s-SWCNTs with exceptional electronic-type purity levels (99.9% s-SWCNTs) were deposited at high deposition velocities using the continuous, floating evaporative self-assembly process. The SWCNTs were made using arc discharge techniques and had diameters in the range from about 13 to about 19 Å.

Substrate Preparation: Rectangular pieces of silicon (approximately 1 cm wide by 3 cm long) were cut from a larger silicon wafer. These silicon pieces served as the substrates to be coated. The substrates were cleaned by a Piranha solution of $H_2O_2$ (33%)/concentrated $H_2SO_4$ (67%) for about 20 min and rinsed with deionized (DI) water. After Piranha treatment, the substrates were covered by a hexamethyldisilizane self-assembling monolayer (vapor deposition).

s-SWCNT Ink Preparation: Mixtures of arc-discharge SWCNT powders (2 mg ml$^{-1}$) and poly[(9,9-dioctylfluorenyl-2,7-diyl)-alt-co-(6,6'-{2,2'-bipyridine})] (PFO-BPy) (American Dye Source, 2 mg ml$^{-1}$) were sonicated for 30 min in toluene (30 ml). The solution was centrifuged in a swing bucket rotor at 50,000 g for 5 min, and again at 50,000 g for 1 hr. The supernatant was collected and filtered through a syringe filter. A distillation removed toluene over a 30 min duration. The residue of PFO-BPy and s-SWCNTs were redispersed in tetrahydrofuran (THF). The s-SWCNT solution in THF was centrifuged at a temperature of 15° C. for 12 hours. The supernatant (excess PFO-BPy) was discarded and the pellet was redispersed into THF. After removing the THF, the residue was dispersed in chloroform to a concentration of 20 $\mu$g/mL or 10 $\mu$g/mL. (Concentrations from 1 to 20 $\mu$g/mL were successfully tested.)

Experimental Apparatus: The substrate was mounted to a motor so that it could be lifted vertically at a uniform speed and then partially submerged in a bath of deionized water. A 20-gauge needle (Hamilton, point style #2—beveled) was used to dispense the s-SWCNT ink into a puddle on the surface of the deionized water. The needle was positioned as follows: at roughly 45° with respect to the surface of the water bath, with the needle's opening facing away from the substrate; the needle's tip was placed in close proximity to the substrate (distances of 40/1000" to 200/1000" were successfully tested); and the needle was lowered toward the water until the tip formed a slight dimple in the water surface. (Needles with gauges from 20 to 34 were successfully tested.)

In one experimental run ("Run A"), a wide (~5 cm) piece of thin sheet metal (stainless steel) was partially inserted to form a "dam" behind the needle. A 1 mm spacer between the needle and dam ensured that the fluid supplied by the needle flowed freely onto the water surface. The dam confines the outward (i.e., away from the substrate) flow of the puddle and thereby enables the use of lower ink flow rates to maintain the puddle.

Experimental Procedure: The s-SWCNT ink was supplied to the puddle in a continuous flow. (Flow rates of 160 to 320 $\mu$L/min. were successfully tested.) Simultaneously, the substrate was lifted vertically out of the deionized water and puddle. (Lift rates from 1 to 15 were successfully tested.) The ink flowed across the surface to the substrate, depositing a monolayer CNT film. The substrate was lifted clear of the water bath at the conclusion of the experiment. Further, post-film formation treatments (annealing, etc.) may be desirable depending on the application, but at this point the film deposition was complete.

Two experimental runs were carried out. In the first, Run A, the concentration of SWCNTs in the ink was 20 $\mu$g/mL; the needle's tip was placed 40/1000" from the substrate surface, measured along a line perpendicular to the substrate; the ink was supplied at a flow rate of 200 $\mu$L/min; and the substrate was lifted vertically at a rate of 15 mm/min. In the second run, Run B, the concentration of SWCNTs in the ink was 10 $\mu$g/mL; the needle's tip was placed 80/1000" from the substrate surface, measured along a line perpendicular to the substrate; the ink was supplied at a flow rate of 320 $\mu$L/min; and the substrate was lifted vertically at a rate of 5 mm/min.

Figure 21:
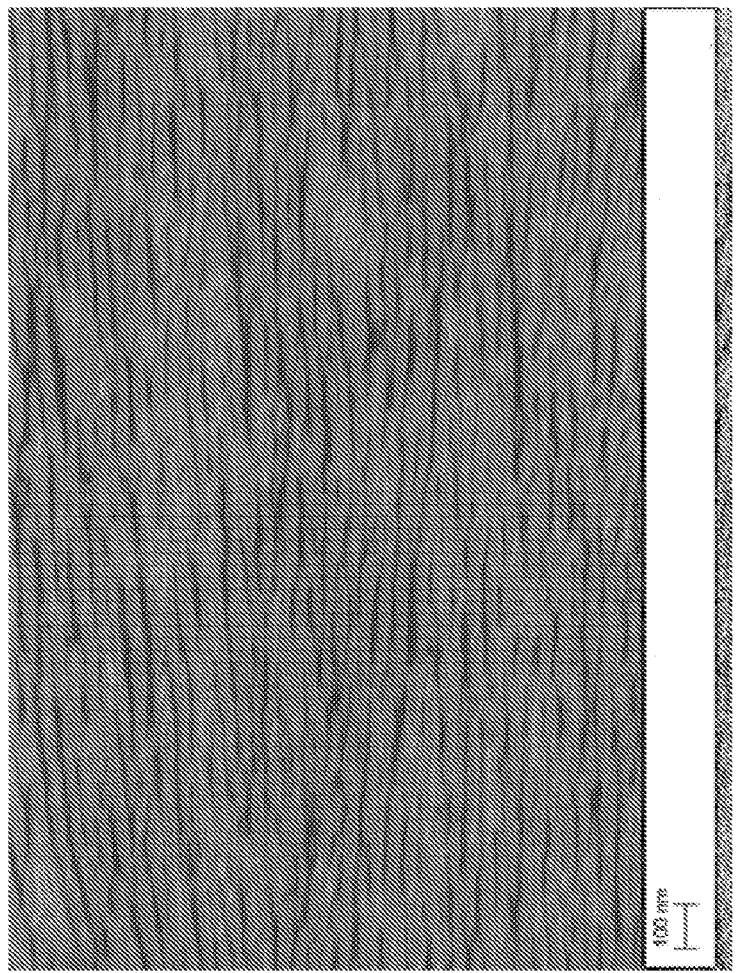
FIG. 21. High resolution SEM image of a first film of aligned s-SWCNTs on a silicon substrate.
Figure 22A:
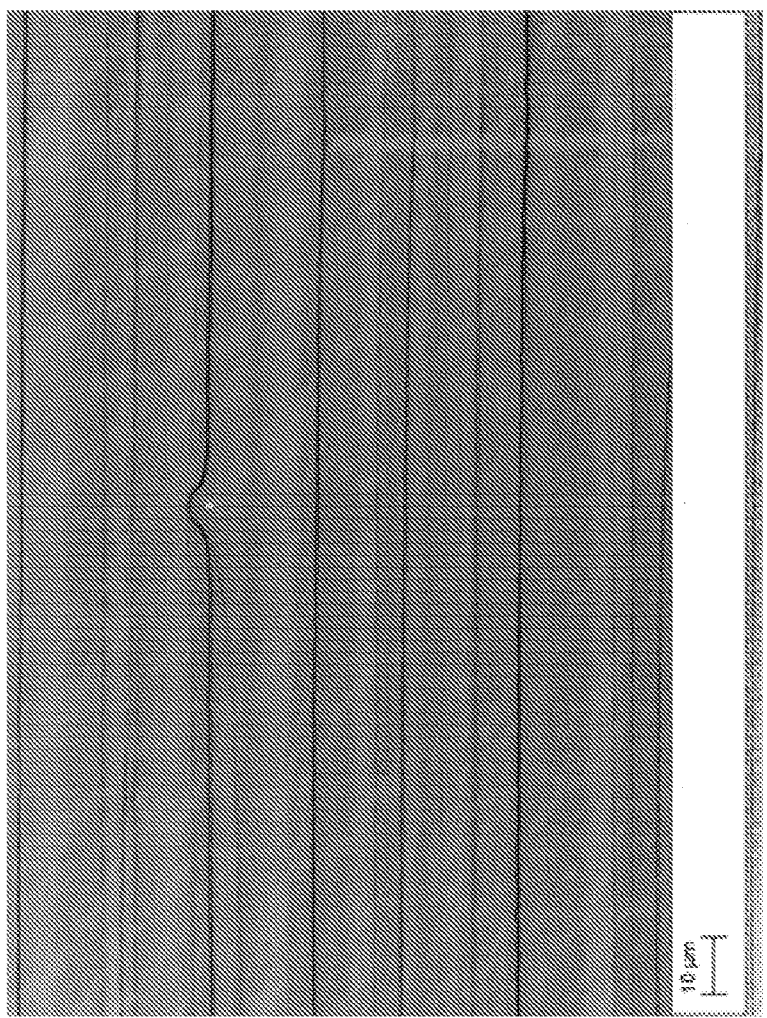
FIG. 22A. High resolution SEM image of a second film of aligned s-SWCNTs on a silicon substrate.
Figure 22B:
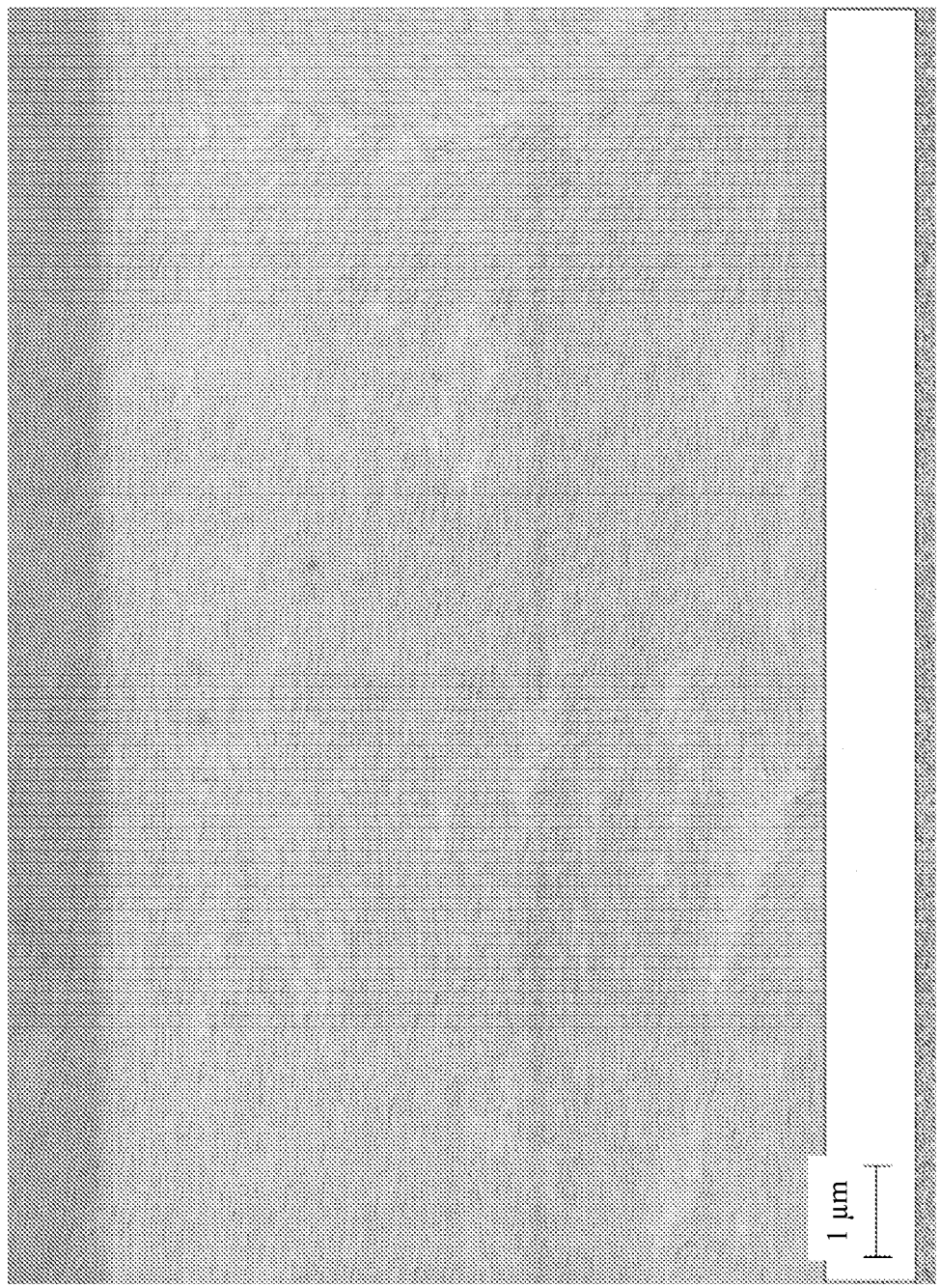
FIG. 22B. High resolution SEM image of an enlarged portion of the SEM image of FIG. 22A.

Film Imaging: The deposited films were imaged using a LEO 1530 FE-SEM (Field Emission Scanning Electron Microscope). The electron beam was accelerated at 5.0 kilovolts. The working distance was adjusted for best image quality; typically in the range of 3.5 to 6.5 mm. The in-lens secondary electron detector was used to obtain the images. No pre-treatment of the samples was used or necessary for imaging by the SEM. FIG. 21 is an SEM image of the aligned s-SWCNT film deposited in Run A. FIG. 22A is an SEM image of the aligned s-SWCNT film deposited in Run B. FIG. 22B shows a magnified portion of the SEM image of FIG. 22A.

Example 4

In this example, a film comprising aligned s-SWCNTs with exceptional electronic-type purity levels (99.9% s-SW-CNTs) were deposited at high deposition velocities using the continuous, floating evaporative self-assembly process. The SWCNTs, which are referred to as (7, 5) s-SWCNTs, were made using a procedure similar to that described in Shea, M. J.; Arnold, M. S., *Applied Physics Letters* 2013, 102 (24), 5.

The (7, 5) s-SWCNT were extracted from a powder of small diameter (0.7-1.2 nm) nanotubes (Southwest Nanotechnologies, Lot# SG65i-L38) derived from cobalt molybdenum catalysis of carbon monoxide disproportionation (CoMoCAT). The (7, 5) species were isolated by dispersing the powder in a solution of poly(9,9-dioctylfluorene-2,7-diyl) (PFO) in toluene. The excess PFO was removed by repeated sedimentation and redispersion in tetrahydrofuran, until a solution of less than 2:1 (w/w) PFO:nanotubes was obtained. In the final step to prepare the s-SWCNT ink for continuous FESA deposition, the nanotubes were dispersed in chloroform and diluted to a concentration of 10 µg/mL.

The PFO:(7, 5) nanotubes were deposited onto HMDS treated Si/SiO$_2$ substrates using similar procedures that were used for FESA deposition of the arc discharge nanotubes. A backing dam was not used for this 7, 5 FESA deposition. A 20 gauge needle, 200 µL/min flow rate controlled by syringe pump, and 5 mm/min substrate lift rate were used.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended here and their equivalents.

What is claimed is:

1. A method of forming a film of aligned semiconducting-Single Wall Carbon Nanotube (s-SWCNTs) on a substrate, the method comprising:
   (a) spreading a liquid solution comprising semiconductor-selective- polymer-wrapped s-SWCNTs dispersed in an organic solvent across the surface of a hydrophobic substrate, wherein the concentration of semiconductor-selective-polymer-wrapped s-SWCNTs in the liquid solution is no greater than 50 µg/ml; and
   (b) withdrawing the hydrophobic substrate from the liquid solution, wherein the semiconductor-selective-polymer-wrapped s-SWCNTs from the liquid solution are deposited as a film of aligned semiconductor-selective-polymer-wrapped s-SWCNTs on the hydrophobic substrate;
   wherein the hydrophobic substrate is withdrawn from the liquid solution, and the film of aligned semiconductor-selective-polymer-wrapped s-SWCNTs is formed, at a rate of at least 1 mm/min and further wherein the film of aligned semiconductor-selective-polymer-wrapped s-SWCNTs has a s-SWCNT linear packing density of at least 35 s-SWCNTs/µm.

2. The method of claim 1, wherein the concentration of semiconductor-selective-polymer-wrapped s-SWCNTs in the liquid solution is no greater than 10 µg/ml.

3. The method of claim 1, wherein the concentration of semiconductor-selective-polymer-wrapped s-SWCNTs in the liquid solution is in the range from 1 µg/ml to 50 µg/ml.

4. The method of claim 1, wherein the concentration of semiconductor-selective-polymer-wrapped s-SWCNTs in the liquid solution is in the range from 1 82 g/ml to 10 µg/ml.

5. The method of claim 1, wherein the hydrophobic substrate is withdrawn from the liquid solution, and the film of aligned semiconductor-selective-polymer-wrapped s-SWCNTs is formed, at a rate of at least 5 mm/min.

6. The method of claim 5, wherein the concentration of semiconductor-selective-polymer-wrapped s-SWCNTs in the liquid solution is in the range from 1 µg/ml to 50 µg/ml.

\* \* \* \* \*

UNITED STATES PATENT AND TRADEMARK OFFICE
CERTIFICATE OF CORRECTION

PATENT NO. : 9,786,853 B2
APPLICATION NO. : 15/118058
DATED : October 10, 2017
INVENTOR(S) : Michael Scott Arnold et al.

It is certified that error appears in the above-identified patent and that said Letters Patent is hereby corrected as shown below:

In the Claims

Column 22, Line 34, Claim 4:
Delete "from 1 82 g/ml to 10 µg/ml" and replace with --from 1 µg/ml to 10 µg/ml--

Signed and Sealed this
Twenty-first Day of August, 2018

Andrei Iancu
*Director of the United States Patent and Trademark Office*